US008679952B2

(12) United States Patent
Tomita et al.

(10) Patent No.: US 8,679,952 B2
(45) Date of Patent: Mar. 25, 2014

(54) METHOD OF MANUFACTURING SILICON CARBIDE EPITAXIAL WAFER

(75) Inventors: Nobuyuki Tomita, Tokyo (JP); Kenichi Hamano, Tokyo (JP); Masayoshi Tarutani, Tokyo (JP); Yoichiro Mitani, Tokyo (JP); Takeharu Kuroiwa, Tokyo (JP); Masayuki Imaizumi, Tokyo (JP); Hiroaki Sumitani, Tokyo (JP); Kenichi Ohtsuka, Tokyo (JP); Tomoaki Furusho, Tokyo (JP); Takao Sawada, Tokyo (JP); Yuji Abe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/696,943

(22) PCT Filed: Mar. 18, 2011

(86) PCT No.: PCT/JP2011/001606
§ 371 (c)(1),
(2), (4) Date: Jan. 28, 2013

(87) PCT Pub. No.: WO2011/142074
PCT Pub. Date: Nov. 17, 2011

(65) Prior Publication Data
US 2013/0126906 A1 May 23, 2013

(30) Foreign Application Priority Data

May 10, 2010 (JP) ................................. 2010-108331
Jun. 7, 2010 (JP) ................................. 2010-130111
Oct. 20, 2010 (JP) ................................. 2010-235589

(51) Int. Cl.
H01L 21/20 (2006.01)
(52) U.S. Cl.
USPC ........... 438/478; 438/507; 438/494; 438/689; 438/785; 257/77; 257/618; 257/619
(58) Field of Classification Search
USPC ............ 438/478, 494, 507, 689, 785; 257/77, 257/618–619
See application file for complete search history.

(56) References Cited

U.S. PATENT DOCUMENTS

| 2007/0264807 | A1 | 11/2007 | Leone et al. |
| 2007/0290211 | A1 | 12/2007 | Nakayama et al. |
| 2009/0272984 | A1* | 11/2009 | Saxler ............................. 257/77 |
| 2012/0146056 | A1 | 6/2012 | Momose et al. |

FOREIGN PATENT DOCUMENTS

| JP | 2002 255692 | 9/2002 |
| JP | 2003 86816 | 3/2003 |
| JP | 2005 51153 | 2/2005 |
| JP | 2005 311348 | 11/2005 |
| JP | 2007 262434 | 10/2007 |
| JP | 2007 284298 | 11/2007 |
| JP | 2008 511753 | 4/2008 |
| WO | 2011 024854 | 3/2011 |

OTHER PUBLICATIONS

Shrivastava, A., et al., "Study of triangular defects and inverted pyramids in 4H-SiC 4° off-cut (0 0 0 1) Si face epilayers," Journal of Crystal Growth, vol. 310, pp. 4443 to 4450. (2008).
Syvajarvi, M., et al., "Step-bunching in SiC epitaxy: anisotropy and influence of growth temperature," Journal of Crystal Growth, vol. 236, pp. 297 to 304, (2002).
International Search Report Issued Jun. 14, 2011 in PCT/JP11/001606 Filed Mar. 18, 2011.

* cited by examiner

Primary Examiner — Dung A. Le
(74) Attorney, Agent, or Firm — Oblon, Spivak, McClelland, Maier & Neustadt, L.L.P.

(57) ABSTRACT

A method is provided in order to manufacture a silicon carbide epitaxial wafer whose surface flatness is very good and has a very low density of carrot defects and triangular defects arising after epitaxial growth. The silicon carbide epitaxial wafer is manufactured by a first step of annealing a silicon carbide bulk substrate that is tilted less than 5 degrees from <0001> face, in a reducing gas atmosphere at a first temperature T1 for a treatment time t, a second step of reducing the temperature of the substrate in the reducing gas atmosphere, and a third step of performing epitaxial growth at a second temperature T2 below the annealing temperature T1 in the first step, while supplying at least a gas including silicon atoms and a gas including carbon atoms.

20 Claims, 26 Drawing Sheets

METHOD OF MANUFACTURING SILICON CARBIDE EPITAXIAL WAFER

TECHNICAL FIELD

The present invention relates to silicon carbide epitaxial wafers used for silicon carbide power devices or the like and manufacturing methods therefor, silicon carbide bulk substrates for epitaxial growth and manufacturing methods therefor, and a heat treatment apparatus for heat treating silicon carbide bulk substrates.

BACKGROUND ART

Since silicon carbide (hereinafter referred to as "SiC") has a larger band gap compared to silicon (hereinafter referred to as "Si") and is excellent in physical properties such as dielectric breakdown field intensity, saturated electron velocity, and thermal conductivity, it has a superior nature as a material for semiconductor power devices. Especially, because significant reduction in power loss, downsizing and the like are possible with a SiC power device resulting in realizing energy saving at conversion for electric power supply, it has possibility of becoming a key device in realizing low carbon society such as improving electric vehicle performance and improving solar cell system function.

When manufacturing a SiC power device, epitaxial growth of a semiconductor device active area in advance on a SiC bulk substrate with a thermal CVD method (thermal-chemical vapor deposition method) or the like is indispensable. Here, the active area means a cross sectional area that is planned to be manufactured by finely controlling doping density in a crystal and a film thickness and that includes a growth direction axis. Such an epitaxial growth layer is necessary in addition to the bulk substrate because the doping density and the film thickness are almost specified by a device design specification and also because finer controllability is usually required compared to that in bulk substrate doping density.

Hereinafter, a wafer of a SiC bulk substrate on which an epitaxial growth layer is formed is referred to as an epitaxial wafer. Since a SiC device is manufactured by performing various processes on an epitaxial wafer, a rate of the number of devices having intended characteristics manufactured from one wafer, that is what is called a yield of semiconductor devices, depends strongly upon electrical characteristic uniformity of the epitaxial growth layer. That is, if there exists a local area whose dielectric breakdown field is smaller than that in another area or which carries a relatively large electric current by applying a predetermined voltage in the epitaxial wafer, a device containing such an area has, for example, an inferior withstand voltage characteristic among its characteristics and there arises a problem of flowing what is called a leakage current even if the applied voltage is relatively small. In other words, a factor primarily rules the yield of semiconductor devices is crystallographic uniformity of the epitaxial wafer. As a uniformity impeding element, there is known a presence of various what is called leakage current defects caused by a problem during the epitaxial growth.

A common characteristic of the above described crystal defects is that periodicity of an atomic arrangement in the crystal is locally imperfect along a crystal growth direction. As a defect generated by the SiC epitaxial growth, a leakage current defect called as a carrot defect, a triangular defect, or the like is known based on its surface shape characteristic.

As a method for preventing generation of such defects, there is described in Patent Document 1, for example, a method of growing an epitaxial growth layer between a bulk substrate and an active layer at a typical growth temperature of less than 1500 degrees C. in order to inhibit defects generation.

Also, there is described in Patent Document 2, for example, an embodiment of obtaining an epitaxial wafer having average basal face dislocation density of 20 pieces/$cm^2$ by 40 minutes hydrogen etching under a condition of a temperature of 1400 degrees C. and a pressure of 30 Torr (4.0 kPa) and further by an epitaxial growth under a 150 degrees C. increased temperature and a relatively increased pressure of 42 Torr (5.6 kPa).

It is well known that specific periodicity called as polytype exists in SiC crystal. That is, while a stoichiometric ratio of Si and C is 1:1 and a crystal lattice has a hexagonal closest packing structure, there exists another kind of periodicity in an atomic arrangement along c-axis of the present structure. Physical properties of SiC are specified by a period in an atomic scale and symmetry of the crystal lattice. A type called 4H—SiC now receives the most attention from a standpoint of device application. In a power device using 4H—SiC, from a standpoint of mainly reducing a raw material cost, mainly used is an epitaxial wafer that has a top surface tilted no more than around 5 degrees in a <11-20> direction from a <0001> face and employing a face where Si atoms can be more stably arranged than C atoms.

In such an epitaxial wafer, asperity having a difference of elevation of several nano-meters usually appears on a wafer surface parallel to a <1-100> direction. The asperity of the surface shape is called as step bunching. In a case of step bunching existence, an electrical carrier induced by an electric field etc. near an epitaxial growth layer surface becomes a direct potential barrier when the carrier moves in a direction not parallel to the step bunching in a face parallel to the surface. That is, mobility or electrical conductivity decreases and device characteristics are degraded. Therefore, when the step bunching exists, a problem arises that uniformity of the electrical conductivity in the wafer face is degraded. Accordingly, when the step bunching exists, in a device such as MOS type in which a carrier is induced near an epitaxial growth layer surface, flexibility of concrete device structure in design and manufacture stages is significantly restricted.

PRIOR ART DOCUMENT

Patent Document

Patent Document 1: Japanese Unexamined Patent Application Publication No. 2007-284298
Patent Document 2: Japanese Unexamined Patent Application Publication No. 2005-311348

SUMMARY OF INVENTION

Problem that the Invention is to Solve

In the method described in Patent Document 1, a defect inhibition layer which is essentially independent of device characteristics and clearly different from an active layer is needed to be separately formed under growth conditions different from those of the active layer. This is very disadvantageous from a standpoint of material gas use efficiency and an epitaxial wafer manufacturing time etc., and a problem of reducing productivity arises. In addition, since electrical characteristics of a device are essentially specified by electrical characteristics of an epitaxial growth layer, a problem of reducing flexibility in device design as a result of adding constraint conditions on a device structure by introducing the defect inhibition layer.

Meanwhile, although such an inhibition layer is not needed in the method described in Patent Document 2, there are needed hydrogen etching for virtually no less than 40 minutes and a practical increase of both pressure and temperature in a growth stage. This is disadvantageous from a standpoint of time effectiveness, i.e. costs, in manufacturing the epitaxial wafer, and a problem related to equipment arises that equipment conditions are needed to be greatly changed, especially large burden on an exhaust system of the equipment. Note that, while there is a description regarding basal face dislocation in Patent Document 2, it does not refer to at all a leakage current defect such as a carrot defect and a triangular defect that essentially specifies a yield of semiconductor devices.

Also, when Si atoms are more stably arranged than C atoms by tilting a SiC bulk substrate surface of 4H—SiC type no more than around 5 degrees in a <11-20> direction from a <0001> face, there is a strong tendency of forming asperity called as step bunching during epitaxial growth, and a serious problem arises that the device structure etc. is greatly restricted in order to avoid influence of the step bunching on device characteristics.

The present invention has been made to resolve such problems, and is to provide a SiC epitaxial wafer that has, after epitaxial growth, very low density of defects which act as current leakage sources on a SiC device, i.e. has a high yield of semiconductor devices, and that has excellent flatness which is an important factor to acquire good electrical characteristics, with ensuring good productivity by reducing time for manufacturing the epitaxial wafer without degrading material gas use efficiency.

Also, the present invention is to provide a SiC bulk substrate for epitaxial growth that is able to acquire a SiC epitaxial wafer having low density of defects, after epitaxial growth, which act as current leakage sources on a SiC device, i.e. having a high yield of semiconductor devices, even if epitaxial growth of an active layer is performed on the SiC bulk substrate without a special pretreatment process such as a process which degrades material gas use efficiency and a process which needs a long time processing and degrades productivity.

In addition, the present invention is to provide a heat treatment apparatus for acquiring a SiC bulk substrate for epitaxial growth that is able to acquire a SiC epitaxial wafer having low density of defects, after epitaxial growth, which act as current leakage sources on a SiC device, i.e. having a high yield of semiconductor devices, even if epitaxial growth of an active layer is performed on the SiC bulk substrate without a special pretreatment process such as a process which needs a long time processing and degrades productivity.

Means for Solving the Problem

A method of manufacturing a silicon carbide epitaxial wafer according to the present invention includes a first step of annealing a silicon carbide bulk substrate that is tilted less than 5 degrees from <0001> face, in an atmosphere containing a reducing gas at a first temperature $T_1$ for a treatment time t, a second step of reducing the temperature of the substrate in the reducing gas atmosphere, and a third step of performing epitaxial growth at a second temperature $T_2$ below the annealing temperature $T_1$ in the first step, while supplying a gas that contains at least a gas including silicon atoms and a gas including carbon atoms.

A method of manufacturing a silicon carbide bulk substrate for epitaxial growth according to the present invention includes a first step of annealing a silicon carbide bulk substrate that is tilted less than 5 degrees from <0001> face, in an atmosphere containing a reducing gas at a first temperature $T_1$ for a treatment time t, a second step of reducing, in the reducing gas atmosphere, the temperature of the silicon carbide bulk substrate to a third temperature $T_3$ lower than the first temperature $T_1$, a third step of stopping supplying the reducing gas, and a fourth step of reducing the temperature of the silicon carbide bulk substrate to a temperature lower than the third temperature $T_3$.

A heat treatment apparatus according to the present invention, includes a treatment chamber for heat-treating a silicon carbide bulk substrate in atmosphere of reducing gas, a reducing gas introduction portion for introducing the reducing gas into the treatment chamber, a substrate supporter for supporting the silicon carbide bulk substrate within the treatment chamber, a reducing-gas exhaust portion for exhausting the reducing gas to an outside of the treatment chamber, a stepped surface reduction member disposed adjacently to the substrate supporter and upstream of the substrate supporter, with respect to a direction in which the reducing gas flows in the treatment chamber, and a heating device for heating the silicon carbide bulk substrate, wherein a surface of the substrate supporter in contact with a flow path of the reducing gas is on substantially the same plane as a surface of the stepped surface reduction member in contact therewith.

Advantageous Effects of the Invention

With a manufacturing method of a SiC epitaxial wafer according to the present invention, a SiC epitaxial wafer can be easily manufactured that has, after epitaxial growth, very low density of defects which act as current leakage sources on a SiC device, and that has excellent wafer surface flatness which is important for acquiring good device characteristics, with ensuring good productivity by reducing time for manufacturing the SiC epitaxial wafer without degrading material gas use efficiency.

Also, with a manufacturing method of a SiC bulk substrate for epitaxial growth according to the present invention, a SiC bulk substrate for epitaxial growth can be easily manufactured that is able to acquire a SiC epitaxial wafer having low density of defects, after epitaxial growth, which act as current leakage sources on a SiC device, even if epitaxial growth is performed without a special pretreatment process of, for example, degrading material gas use efficiency or degrading productivity.

In addition, with the heat treatment apparatus according to the present invention, the heat treatment apparatus can be acquired that can easily manufacture a SiC bulk substrate for epitaxial growth that is able to acquire a SiC epitaxial wafer having low density of defects, after epitaxial growth, which act as current leakage sources on a SiC device, even if epitaxial growth is performed without a special pretreatment process of requiring a long time processing etc. which degrades productivity.

MODE FOR CARRYING OUT THE INVENTION

Embodiment 1

Figure 1:
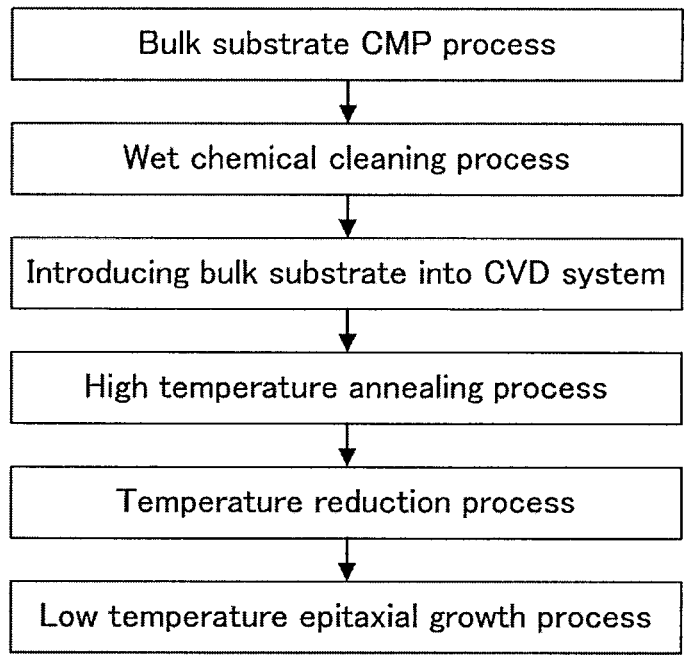
FIG. 1 is a process flow showing a procedure of manufacturing a SiC epitaxial wafer according to Embodiment 1 of the present invention.

FIG. 1 is a process flow showing a procedure of manufacturing a SiC epitaxial wafer according to Embodiment 1 of the present invention.

A SiC bulk substrate used in the present invention is 4H—SiC type, and has a specification of tilting no more than around 5 degrees in a <11-20> direction from a <0001> face. Note that the tilting direction is not limited to the <11-20> direction, and a substrate may have a specification of tilting in another direction.

First, the SiC bulk substrate is preliminarily subjected to flattening process (CMP process) with chemical mechanical polishing by mechanical polishing and using chemical solution having an acid or alkaline property. The SiC bulk substrate after the flattening process is subjected to ultrasonic cleaning by using acetone or the like, so that organic substances adhered to the top surface thereof will be removed. Next, mainly adhered metals are removed by immersing the SiC bulk substrate in mixed solution which is heated to be around 130 degrees C. (±5 degrees C.) and in which sulfuric acid and hydrogen peroxide solution are mixed in a volume ratio of 5:1. In addition, remaining adhered metals are removed by aqua regia.

After that, the SiC bulk substrate is subjected to what is called RCA cleaning. That is, after being immersed in mixed solution which is heated to be 75 degrees C. (±5 degrees C.) and in which ammonia water and hydrogen peroxide solution are mixed in 1:9, the substrate is immersed in mixed solution which is heated to be 75 degrees C. (±5 degrees C.) and in which hydrochloric acid and hydrogen peroxide solution are mixed in 1:9. Also, after being immersed in aqueous solution containing around 5% hydrofluoric acid in volume ratio, the SiC bulk substrate is subjected to top surface washing by performing substitution process with pure water. However, the SiC bulk substrate top surface cannot be made as clean as another semiconductor material such as silicon by a series of above described wet chemical cleaning with chemical solution. The reason is that, since inter-atomic force of SiC crystal is significantly stronger than interatomic force of conventional semiconductor, chemical solutions which uniformly dissolve the SiC bulk substrate top surface has not yet been found.

Figure 2:
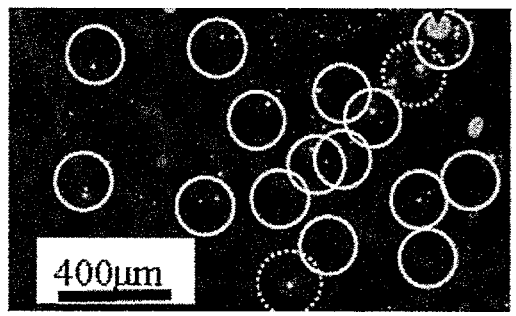
FIG. 2 is an optical microscope image of a SiC bulk substrate top surface under a dark field after a wet chemical process according to Embodiment 1 of the present invention.

FIG. 2 is a result of optical microscope observation under a dark field on the SiC bulk substrate top surface after the above described process. As will be described later, triangular defects are observed at areas enclosed with solid lines after epitaxial growth, while carrot defects are observed at areas enclosed with dotted lines. Relatively intense bright light is detected at the areas enclosed with the dotted lines, and relatively weak bright light is detected in the areas enclosed with the solid lines or at the neighboring outer areas thereof. It is noted that a straight line shape indicated by a solid arrow is caused by a polishing scratch on the SiC bulk substrate bottom surface, and very intensely bright portion is a reflection of asperity of the bottom surface. Furthermore, while small punctiform bright portions are observed by precise observation, these portions do not affect the subsequent results. Since such an observation method is sensitive for top surface conditions, it is found that some micro particles are adhered to the SiC bulk substrate top surface by such an observation.

Figure 3:
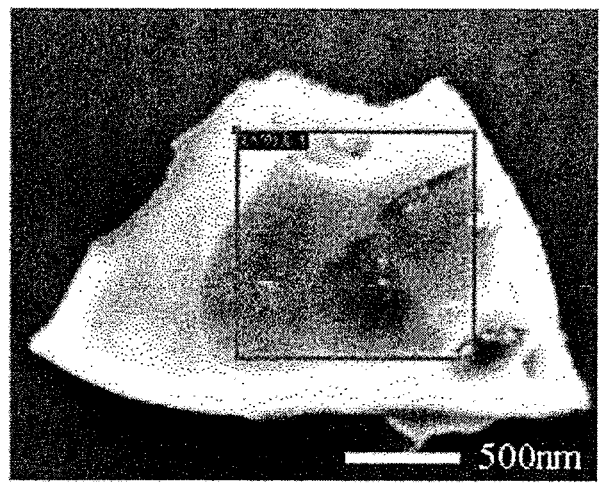
FIG. 3 is a scanning electron microscope image of a SiC dust present at the SiC bulk substrate top surface after the wet chemical process according to Embodiment 1 of the present invention.
Figure 4:
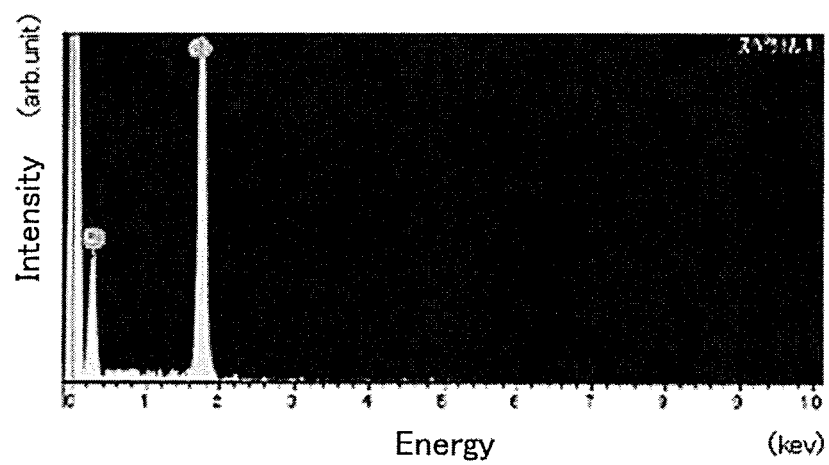
FIG. 4 is an energy-dispersive X-ray analysis spectrum of the SiC dust present at the SiC bulk substrate top surface after the wet chemical process according to Embodiment 1 of the present invention.

A result of further evaluating, by a scanning electron microscope, the SiC bulk substrate after the above described process is shown in FIG. 3. As is clear from FIG. 3, a foreign substance present at the micro bright portion has sharp corners, and it is determined that the size thereof is at least at a micrometer scale. A spectrum acquired by energy-dispersive X-ray spectroscopy on an area enclosed with a square in FIG. 3 is shown in FIG. 4. In FIG. 4, a vertical axis represents spectral intensity and a horizontal axis represents energy. From the figure, because there are strong peaks from carbon and silicon, it is understood that the foreign substance is composed of SiC having a stoichiometric ratio of 1:1 judging from relative strength of these peaks. That is, although performing above described various kinds of cleaning, it is proved that SiC dusts are still adhered to the SiC bulk substrate top surface.

Figure 5:
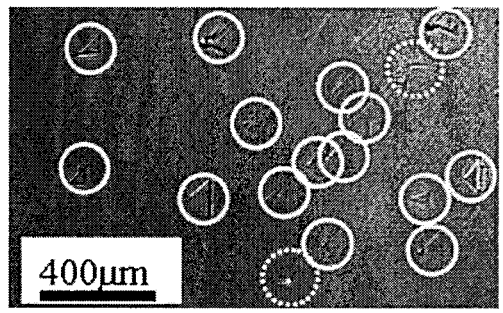
FIG. 5 is a Nomarski differential interference optical microscope observation image of the same area as in FIG. 2 under a bright field observed after epitaxial growth according to Embodiment 1 of the present invention.

FIG. 5 shows an image by a differential interference optical microscope on the area where top surface observation is performed preliminarily under the dark field on the SiC bulk substrate as shown in FIG. 2 and the epitaxial growth is performed thereafter at 1475 degrees C. While treatment temperatures in experimental results acquired during processes leading to the present invention will be described in detail hereinafter, indicated values of such treatment temperatures strongly depend on a measurement method in CVD system. Therefore, measured temperatures in the present invention are converted to measured values of pyrometer in principle. Additionally, when a temperature is measured in another method, it may be adjusted by calculating an offset value from a value simultaneously measured by a pyrometer.

As is clear from FIG. 5, inventors of the present invention have found the fact for the first time that there is formed a leakage current defect such as the carrot defect at the neighborhood of the area enclosed with the dotted lines and the triangular defect at the neighborhood of the area enclosed with the solid line in FIG. 2. Also, while the positions where the relatively weak bright portions are detected in FIG. 2 do not completely correspond to the positions where the triangular defects are detected in FIG. 3 and there are seen some portions having deviations in some 100-μm level, this clearly shows a substantial movement in a process that will be described later.

Furthermore, when a power device has an area containing such defects, it is usually known that a leak current occurs when a high voltage is applied. That is, the existence of such defects becomes a direct factor to significantly reduce a yield of semiconductor devices. Therefore, there can never be acquired an epitaxial growth layer that has good uniformity and is preferable for manufacturing a power device without removing such defects.

In order to remove the SiC dusts which cause various kinds of defects, the inventors of the present invention have repeatedly performed various experiments by trial and error. As a result, the inventors have obtained a new knowledge that the SiC dusts can be removed most effectively and also an epitaxial top surface having an excellent flatness can be obtained by a series of processes described below in detail. The SiC dust removing processes which characterize the present invention will be described hereinafter.

First, a SiC bulk substrate is placed on a graphite substrate holder coated by, for example, a SiC film, and placed in a reactor of a CVD system. In order to inhibit unintended molecular or atomic impurities remaining in the reactor being mixed into an epitaxial growth layer, the inside of the reactor is evacuated down to about $1 \times 10^{-7}$ kPa.

Figure 6:
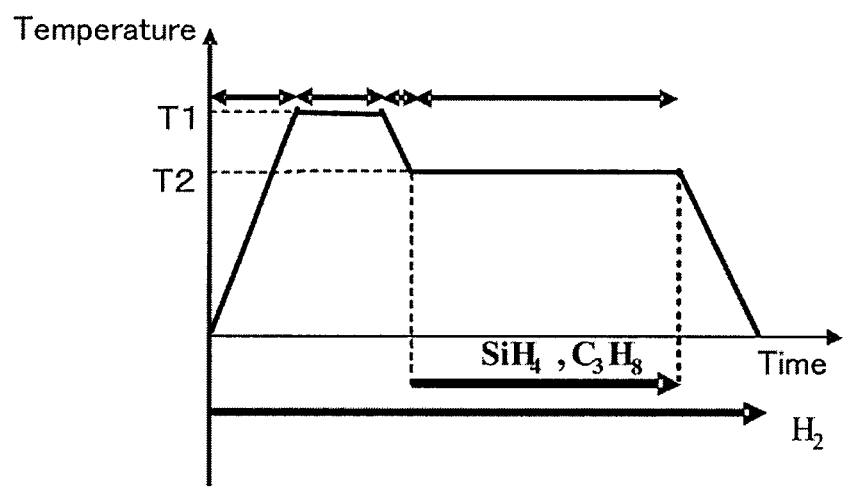
FIG. 6 is a SiC epitaxial wafer substrate temperature change with time and a gas flow according to Embodiment 1 of the present invention.

Next, under a temperature profile and a gas sequence shown in FIG. 6, there is produced a SiC epitaxial wafer, that is a wafer in which the epitaxial growth layer is formed on the SiC bulk substrate.

First, a hydrogen gas, for example, is introduced into the reactor as a reducing gas. Here, the hydrogen gas acts concurrently as a carrier gas. Under a condition that the substrate top surface contacts the reducing gas after the introduction thereof, a reactor pressure is controlled so that a degree of vacuum is maintained constant, for example about 25 kPa. While an experimental example under the above mentioned pressure will be described in detail in this embodiment, a preferable pressure for each of CVD systems may be changeable in general depending on differences in reactor structures and shapes, etc., and a decompression atmosphere with a range from 1 kPa through 70 kPa is preferable if such differences are considered. The reasons are that substitution reaction efficiency by the reducing gas which will be described later is degraded when the pressure is lower than 1 kPa, and the flatness of the obtained epitaxial growth layer surface is degraded when the pressure is higher than 70 kPa because etching on the SiC bulk substrate becomes dominant.

Next, the SiC bulk substrate is heated to a predetermined treatment temperature T1 by mainly heating the substrate holder with a high frequency induced current. Generally, for the purpose of inhibiting preferential desorption of carbon atoms from the SiC bulk substrate, supplying a gas containing carbon, for example propane, to the reactor is started when a substrate temperature reaches a temperature about 100 degrees C. lower than a crystal growth starting temperature. However, it is found that, when such a gas containing carbon atoms is supplied in advance, asperity of the SiC bulk substrate top surface has a tendency to increase, i.e. manifestation of step bunching, as duration of advancing supply of the gas containing the carbon becomes long, because surface reconstruction of atoms occurs prominently on the SiC bulk substrate top surface whose above described tilting angle is no more than around 5 degrees. That is, the inventors of the present invention have found that it is important for ensuring the flatness not to start the propane supply until the growth start.

After the substrate temperature is increased, it is kept for a predetermined time in a reducing gas atmosphere at a relatively high temperature T1, for example more than or equal to 1550 degrees C. An annealing process at such a high temperature decreases the leakage current defects such as the carrot defect and the triangular defect, and at the same time, is indispensable for acquiring an epitaxial wafer having an excellent flatness. As will be described later, it is necessary to perform the epitaxial growth at relatively low temperature of about 1475 degrees C. in order to get an epitaxial growth surface having flatness and no step bunching, because the leakage current defects such as the carrot defects and the triangular defects are generated at high density of at least 10 pieces/cm$^2$ when the annealing process at the high temperature, as described above, is not performed.

As described above, since the generation of the carrot defects and the triangular defects are mainly caused by the SiC dusts adhered to the SiC bulk substrate, the process in a reducing gas atmosphere for annealing the SiC dusts chemically adhered to the SiC bulk substrate is very effective in order to selectively remove the SiC dusts without damaging the SiC bulk substrate itself.

That is, the SiC dusts are speculated to be adhered to the SiC bulk substrate in the hydrofluoric acid solution used at the last stage of the above described process with chemical solution. The hydrofluoric acid treatment is originally for removing an oxide film on the SiC surface. Therefore, no oxide film is formed in the hydrofluoric acid solution both on the SiC bulk substrate and the adhered SiC dusts. When the SiC bulk substrate which has been immersed in the hydrofluoric acid solution is exposed to the atmosphere, oxidation on both surfaces of the SiC bulk substrate and the adhered SiC dusts immediately starts. Because the SiC dust surface is not flat judging from the SiC dust shape, the SiC dust is speculated to be adhered to the SiC bulk substrate through a thin oxide film. Therefore, in order to selectively remove the SiC dust from the substrate top surface without damaging the SiC bulk substrate, stabilizing process is very effective in which the both surfaces are hydrogen-substituted by hydrogen atoms, for example, contained in the reducing gas after removing the both oxide films by the annealing process in a reducing gas atmosphere. This is because, by such a process, the both surfaces are hydrogen terminated with each other resulting in generation of an electrochemical repulsive force between the both and, in addition, the SiC dusts can be moved from the SiC bulk substrate top surface area to a downstream side of the gas by a gas flow itself. As a result, the SiC dusts adhered to the SiC bulk substrate top surface are removed without damaging the SiC bulk substrate at all.

As a result of repeatedly performing experiments under various conditions by the inventors of the present invention, it is proved that the annealing temperature in which the above described hydrogen substitution efficiently occurs is no less than 1525 degrees C. That is, it can be said that 1525 degrees C. is the lowest annealing temperature in which an annealing effect appears effectively. Table 1 shows the sum of the carrot defects and the triangular defects density which are observed and counted by surface observation with an optical microscope when the annealing temperature (T1) is each changed from 1525 through 1600 degrees C. by 25 degrees C. and the annealing process is each performed by a treatment time of 10, 180, and 420 seconds.

TABLE 1

| | Annealing temperature (degree C.) | | | |
|---|---|---|---|---|
| Time (second) | 1525 | 1550 | 1575 | 1600 |
| 10 | — | 3.3 pieces/cm$^2$ | 1.4 pieces/cm$^2$ | 0.83 pieces/cm$^2$ |
| 180 | — | 2.3 pieces/cm$^2$ | 0.70 pieces/cm$^2$ | 2.6 pieces/cm$^2$ |
| 420 | 3.1 pieces/cm$^2$ | 0.97 pieces/cm$^2$ | 3.0 pieces/cm$^2$ | >30 pieces/cm$^2$ |

When the annealing temperature T1 is set to be 1525 degrees C., the defect density at the annealing treatment time of 420 seconds is 3.1 pieces/cm$^2$ and it is decreased to one third or less compared to a case in which the annealing process is not performed. When the annealing temperature T1 is set to be 1550 degrees C., the defect density is no more than 3 pieces/cm$^2$ at the annealing treatment time of no less than 180 seconds. Also, when the annealing temperature T1 is set to be 1575 degrees C., a result of 0.7 pieces/cm$^2$ is obtained at the annealing treatment time of 180 seconds. When the annealing temperature T1 is set to be 1600 degrees C., while good results of 0.83 pieces/cm² at the annealing treatment time of 10 seconds and 2.6 pieces/cm² at 180 seconds are obtained, the density is rapidly deteriorated to more than 30 pieces/cm² at 420 seconds.

Realization of lowering the defect density with relatively short time period by increasing the annealing temperature T1 is coincident with the general knowledge that the chemical reaction is accelerated at high temperature. However, when the annealing temperature T1 is 1600 degrees C., the triangular defect density is increased at the annealing treatment time of 420 seconds. The reason seems to be that etching of the SiC bulk substrate top surface with the reducing gas becomes dominant in addition to desorption of the SiC dusts. In other words, because of forming SiC droplet by over etching of the SiC bulk substrate with the reducing gas, dissolving part of the SiC dusts themselves on the SiC bulk substrate to unify with the SiC bulk substrate, or the like, good flatness acquired by the CMP process is locally deteriorated. As a result, such deterioration generates new abnormal growth nucleuses.

Therefore, from a standpoint of working hours efficiency, an annealing temperature T1 of no less than 1550 degrees C. is preferable and no less than 1575 degrees C. is more preferable. When the annealing temperature T1 is 1550 degrees C., the annealing treatment time t of no less than 420 seconds is desirable. When the annealing temperature T1 is 1575 degrees C., the annealing treatment time t of no more than 420 seconds, or more preferably of 180 seconds, is desirable. When the annealing temperature T1 is 1600 degrees C., the annealing treatment time t of less than 180 seconds, or around 10 seconds, is desirable. As shown in a series of experimental results, as the annealing temperature T1 increases, the annealing time t tends to decrease. In addition, while a case is described here in which the annealing temperature T1 is kept constant throughout the annealing treatment time t, the annealing temperature T1 may have time variation instead of keeping it constant in order to shorten the treatment time. In that case, a peak temperature corresponds to the above described annealing temperature T1.

Next, the substrate temperature is decreased in the reducing gas atmosphere while keeping the pressure constant. The time needed for the temperature reduction process is about five minutes at the CVD system used in a series of experiments relating to the present invention. Furthermore, the temperature reduction time especially depends on a cooling system structure of the CVD system. As to the time needed for the temperature reduction process, the shortest possible time is preferable. The reason is as follows. That is, while the SiC dusts adhered to the substrate top surface at a stage of introducing the SiC bulk substrate can be removed by the desorption process with the reducing gas, when the time needed for the temperature reduction process is long, a problem arises in which the remaining SiC dusts etc. adhered to the inside of the CVD system are newly adhered to the SiC bulk substrate top surface purified by the above mentioned high temperature annealing process, and the adhered SiC dusts etc. become the abnormal growth nucleuses at the epitaxial growth stage, which is the subsequent process, resulting in forming new leakage current defects.

What is particularly problematic is the SiC powder dusts adhered on the surface of components located in a direction from which the reducing gas, material gas, or the like flows over the SiC bulk substrate (what is called upper stream side), and components such as the substrate holder and a susceptor that configure a heating area of the upper surface opposite to the SiC bulk substrate. Such SiC powder dusts are formed on the surface of the members concurrently with the SiC epitaxial growth on the SiC bulk substrate, and generated by adhering to the SiC bulk substrate. Therefore, it is very difficult to prevent the formation of SiC powder dusts themselves. Also, changing all of the members every time performing the epitaxial growth is disadvantageous from a standpoint of manufacturing cost. Therefore, when the epitaxial wafers are repeatedly manufactured, since the SiC powder dusts adhered to the members heated in the CVD system are adhered to the SiC bulk substrate top surface once purified by the high temperature annealing process, the temperature reduction process of short time period is more preferable in order to decrease the problem of causing the leakage current defect such as the carrot defect and the triangular defect after the epitaxial growth.

Subsequent to the above described high temperature annealing process and substrate temperature reduction process in the reducing gas atmosphere, the epitaxial growth is started by beginning material gas supply after reaching a predetermined crystal growth temperature T2. Note that, while a case is shown in which the material gas is begun to supply after the completion of the temperature reduction process, the material gas supply may be started during the temperature reduction process in order to shorten a total process time.

While a preferred flow rate of the material gas can not be uniformly specified since it is determined depending on the structure or the pressure of the reactor and also varies a lot based on the growth speed, the epitaxial growth was performed in the CVD system used in the present invention with a sequence of at least starting concurrently the supply of silane, as a gas containing silicon atoms, diluted by 90% with hydrogen at a flow rate of 90 sccm for example, and of propane, as a gas containing carbon atoms, at a flow rate of 2.4 sccm for example.

Also, nitrogen gas for n-type doping may be concurrently supplied as necessary, and organic metal material containing aluminum, boron, and beryllium may be supplied for p-type doping. In addition, hydrogen chloride gas may be concurrently used for the purpose of increasing the growth speed, and silane may be used as a gas containing silicon atoms.

Furthermore, when the epitaxial growth is performed at a crystal growth temperature T2 in which desorption of the SiC dusts efficiently occurs, for example 1550 degrees C., migration of silicon atoms at the substrate surface mainly becomes excessive, and almost periodical asperity at more than a micrometer scale along a <11-20> direction is formed in a growth onto the SiC bulk substrate which has a tilting angle of about 5 degrees, for example.

Figure 7:
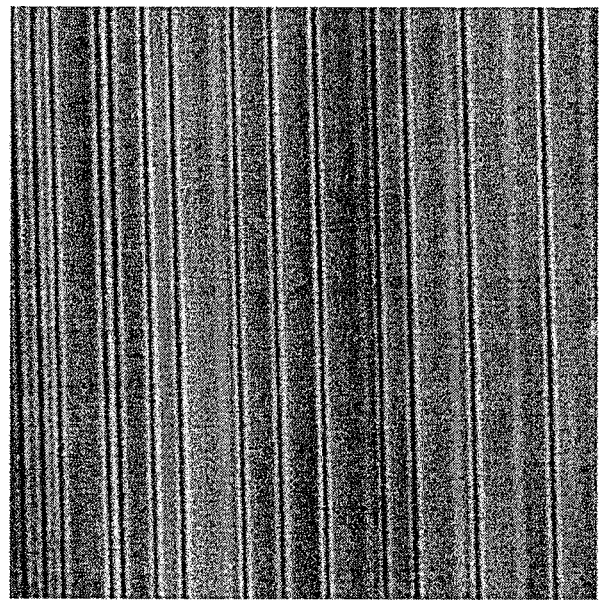
FIG. 7 is an atomic force microscope image of a 10 µm square area of a wafer surface on which an epitaxial growth is performed at a crystal growth temperature of 1550 degrees C. according to Embodiment 1 of the present invention.
Figure 8:
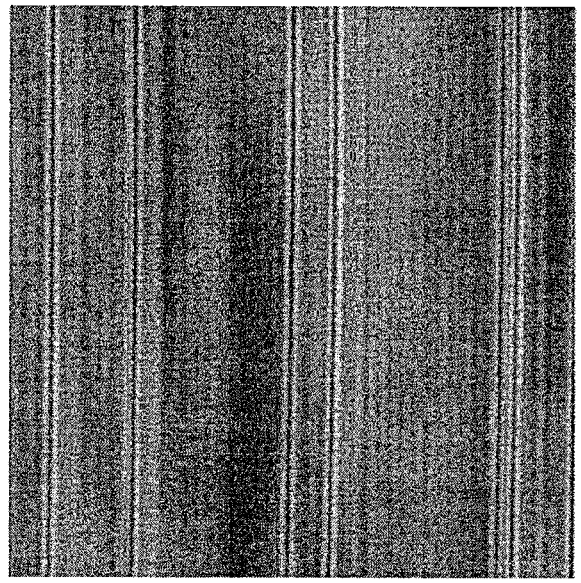
FIG. 8 is an atomic force microscope image of a 10 µm square area of a wafer surface on which an epitaxial growth is performed at a crystal growth temperature of 1525 degrees C. according to Embodiment 1 of the present invention.
Figure 9:
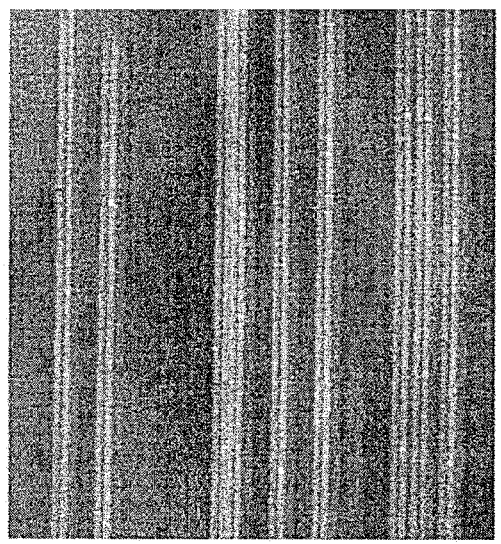
FIG. 9 is an atomic force microscope image of a 10 µm square area of a wafer surface on which an epitaxial growth is performed at a crystal growth temperature of 1500 degrees C. according to Embodiment 1 of the present invention.

FIG. 7 is an image of an atomic force microscope on a 10 μm square area of a wafer surface on which the epitaxial growth is performed at a crystal growth temperature T2 of 1550 degrees C. The height difference is about 6 nm, which is several times larger than 1 nm that is a basic unit structure in a c-axis direction of 4H—SiC, and a surface having atomic scale flatness could not be obtained. The asperity shape is called step bunching, as is described above.

Figure 10:
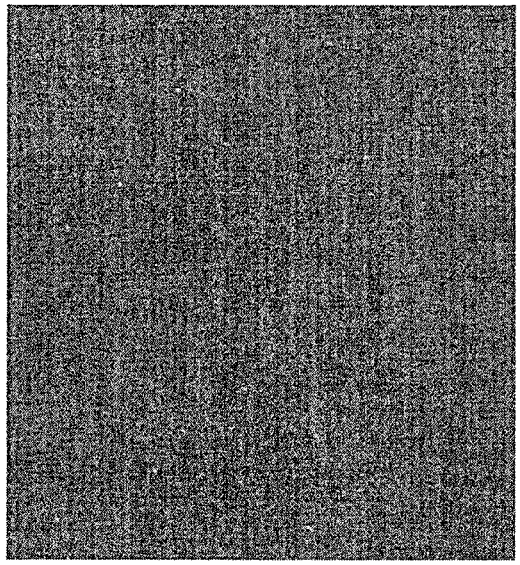
FIG. 10 is an atomic force microscope image of a 10 µm square area of a wafer surface on which an epitaxial growth is performed at a crystal growth temperature of 1475 degrees C. according to Embodiment 1 of the present invention.
Figure 11:
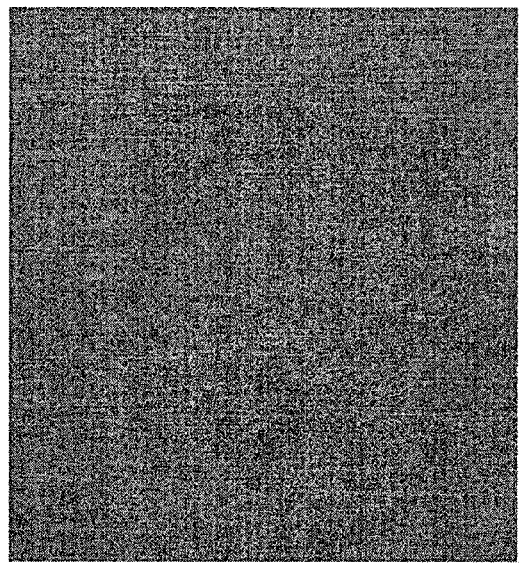
FIG. 11 is an atomic force microscope image of a 10 µm square area of a wafer surface on which an epitaxial growth is performed at a crystal growth temperature of 1450 degrees C. according to Embodiment 1 of the present invention.

In order to acquire an epitaxial growth surface having atomic scale flatness by inhibiting the step bunching, experiments were repeatedly performed with variously changing the crystal growth temperature T2. In FIGS. 8, 9, 10, and 11, there are shown evaluation results by an atomic force microscope on a 10 μm square area of the wafer on which the epitaxial growth of 6-μm film thickness is performed by varying the crystal growth temperature T2 at 1525, 1500, 1475, and 1450 degrees C., respectively. As a result, it was proved that the epitaxial growth layer surface is markedly flattened when the crystal growth temperature T2 is set no less than 1475 degrees C., that is lower than the annealing temperature T1 by 75 degrees C. or more. That is, as shown in FIG. 10, the step bunching was not observed. In addition, when the crystal growth temperature T2 is lowered to 1450 degrees C., the flatness is markedly improved as shown in FIG. 11, and the epitaxial growth layer, having a very good flatness whose Ra is no more than 0.2 nm is obtained.

That is, by setting the crystal growth temperature T2 lower than the annealing temperature T1, a good epitaxial growth layer surface was obtained. Also, it was proved that the epitaxial growth layer having a markedly flattened surface can be obtained when the crystal growth temperature T2 is set to be lower than the annealing temperature T1 by 75 degrees C. or more.

Embodiment 2

In Embodiment 1, dependency of the SiC bulk substrate surface condition on the annealing temperature has been described in detail. In the annealing process, the annealing temperature T1 and the treatment time t are generally important factors. That is, as to the effect of the annealing process on the wafer, these two parameters should be considered concurrently. It can be said in general that degree of heat treatment becomes larger as the annealing temperature becomes higher and the treatment time becomes longer. That is, T1×t, i.e. the product of the annealing temperature T1 and the treatment time t, directly represents the degree of heat treatment. Also, as described above, the experimental results in Table 1 also suggest that the optimal treatment time t changes depending on the annealing temperature T1. That is, in principle, there is a tendency that, when the annealing temperature T1 becomes higher, defect density decreases as the treatment time t becomes shorter.

While the treatment time itself may be simply applied as the treatment time t, as to the annealing temperature T1, it is more appropriate to introduce a standardized temperature by setting an offset temperature To at which the annealing effect appears, rather than directly applying the actual annealing temperature. That is, (T1−To)×t is considered to represent the degree of heat treatment. Note that its unit is represented as K·s.

Figure 12:
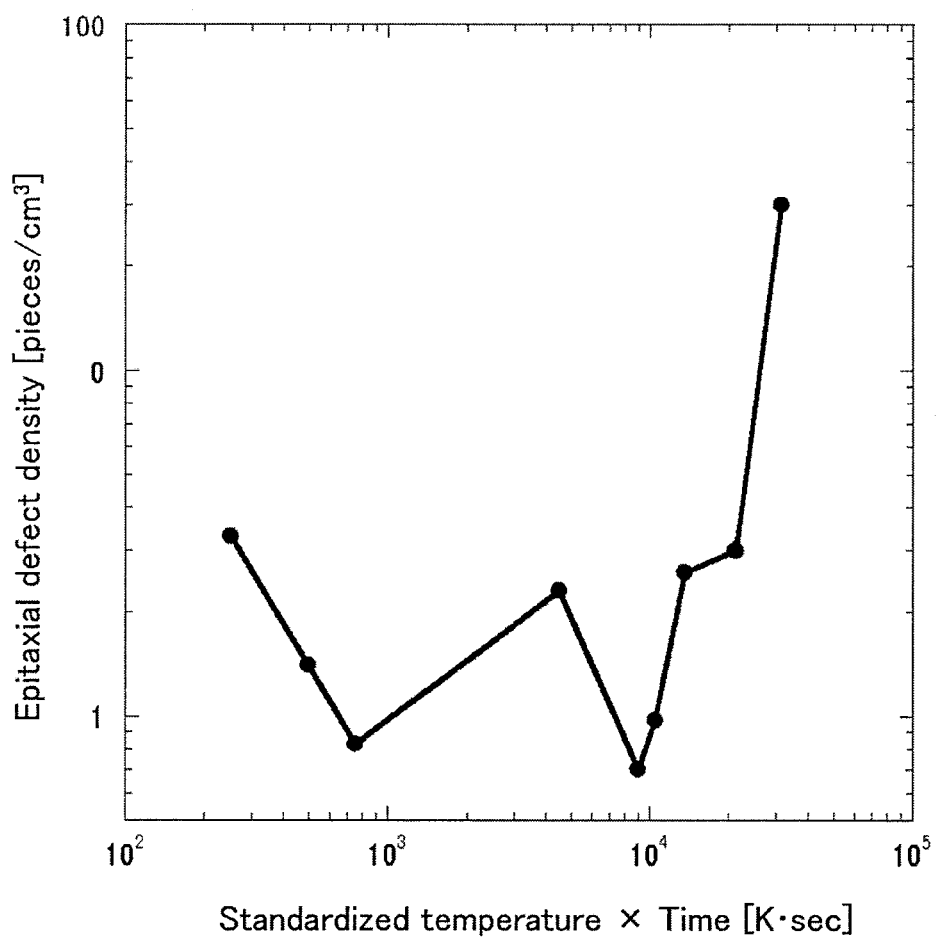
FIG. 12 is a diagram showing a relationship between epitaxial defect density and a product of a standardized temperature and a time according to Embodiment 2 of the present invention.

FIG. 12 shows the results. A horizontal axis represents a product of the standardized temperature and the time, i.e. (T1−To)×t, which is calculated for each annealing temperature T1 and treatment time t in Table 1, and a vertical axis represents the defect density at each condition. Here, the offset temperature To was set to be 1525 degrees C. that is the lowest temperature at which the annealing effect appears.

As will be seen from FIG. 12, there is obtained a wafer having a defect density at practical level, i.e. no more than 3.3 pieces/cm², when (T1−To)×t is within a range of 0-21000 K·s. In a range of 500-13500 K·s, more preferable result of no more than 2.6 pieces/cm² is obtained.

Finding a preferable range by introducing such a parameter allows for promptly finding a preferable treatment time t when the annealing temperature T1 is varied or a preferable annealing temperature T1 when a desired constant treatment time t is selected, from experimental results of above described Table 1 level without performing cyclopedic experiments over all process conditions.

Embodiment 3

In Embodiment 1 and Embodiment 2, dependency of the epitaxial wafer surface condition on the annealing temperature and dependency of the defect density on the annealing temperature T1 and the annealing time t have been described in detail. That is, a method for obtaining a high quality epitaxial growth layer having low defect density and good surface flatness is described.

Meanwhile, as an index for a high quality epitaxial wafer in an actual device, lower n-type residual impurity density in the epitaxial growth layer is important in addition to the above described defect density and surface flatness.

Here, "n-type residual impurity" means an n-type impurity unintentionally contained in the epitaxial growth layer during the epitaxial growth. The n-type residual impurity stems from, for example, nitrogen in the air remaining in the CVD system, gas discharged from a heat insulating material arranged in the CVD system, or the like.

In a high n-type residual impurity density case, there arises a problem that density control of a doped impurity becomes difficult when the impurity is intentionally doped into the epitaxial growth layer. For example, when an n-type impurity is intentionally doped into the epitaxial growth layer at $10^{17}$ $cm^{-3}$ level or less, it is difficult to control the density of doping into the epitaxial growth layer if the n-type residual impurity density is at $10^{16}$ $cm^{-3}$ level.

That is, as for a high quality epitaxial wafer, a wafer having low defect density, good surface flatness, and low n-type residual impurity density of, for example, $2 \times 10^{16}$ $cm^{-3}$ level or less is preferable as an epitaxial wafer for a device. Thus, the inventors repeatedly performed the evaluation of the n-type residual impurity density in the epitaxial growth layer in addition to the above described evaluation of the epitaxial growth, evaluation of its surface condition on an atomic scale, and number count of the defect density.

In order to evaluate the n-type residual impurity density, an epitaxial growth was performed without a procedure of doping the intentional impurity into the epitaxial growth layer such as, for example, supply of nitrogen into the CVD system. Since there was no intentional doping, all of the n-type impurities contained in the formed epitaxial growth layer are residual impurities. Therefore, the n-type residual impurity density can be evaluated by evaluating the density of the n-type impurities thus formed in the epitaxial growth layer.

The n-type residual impurity density was evaluated by what is called C-V measurement. The C-V measurement is a method for evaluating impurity density in an epitaxial wafer by applying voltage on the epitaxial wafer and measuring its capacitance.

As a result of repeatedly performing experiments of evaluating the n-type residual impurity density according to the above described method, in a case of a SiC bulk substrate having an off-axis <0001> of less than 5 degrees, among principal experimental parameters relating to the epitaxial growth, fine control of atomic ratio of carbon atom and silicon atom (hereinafter referred to as "C/Si ratio" or "C/Si") in all material gases supplied during the epitaxial growth was proved to be especially important for controlling the n-type residual impurity density in the epitaxial growth layer. Hereinafter, the experimental results will be described in detail.

A process flow for manufacturing the epitaxial wafer is similar to that in above described Embodiment 1. That is, after the CMP process and the wet chemical cleaning process are first performed on the SiC bulk substrate, the SiC bulk substrate is introduced into the reactor of the CVD system. The high temperature annealing process was performed at the annealing temperature T1 for the annealing time t in the reducing gas atmosphere, and after the substrate temperature reduction process was performed and the temperature reached the predetermined crystal growth temperature T2, the epitaxial growth was started by beginning the material gas supply. Here, the annealing temperature T1 was 1575 degrees C., the annealing time t was 180 seconds, the crystal growth temperature T2 was 1450 degrees C., and the epitaxial growth layer thickness was 6 μm.

Next, material gas supply conditions in a low temperature epitaxial growth process will be described. A flow rate of silane diluted by 90% with hydrogen (i.e. a mixed gas of hydrogen to silane ratio being 9 to 1) was kept constant at 90 sccm. Meanwhile, epitaxial growth was performed for each of propane flow rates of 1.8 sccm (C/Si=0.6), 2.4 sccm (C/Si=0.8), 3.0 sccm (C/Si=1.0), 3.6 sccm (C/Si=1.2), and 4.2 sccm (C/Si=1.4). Here, since the flow rate of silane gas was kept constant, C/Si ratio varies depending on the flow rate of the propane. Furthermore, what is called "monosilane" was used as "silane".

As for all of the epitaxial wafers obtained by performing the epitaxial growth by varying the flow rate of the propane, i.e. C/Si ratio, under the above described conditions, the defect density of the epitaxial growth layer surface was no more than 0.7 pieces/cm$^2$. When the epitaxial growth layer surface of each of the epitaxial wafers is observed by an atomic force microscope, there was no step bunching on all the epitaxial wafers. In this way, very low defect density and good surface flatness of the epitaxial growth layer for all the epitaxial wafers was confirmed.

Figure 13:
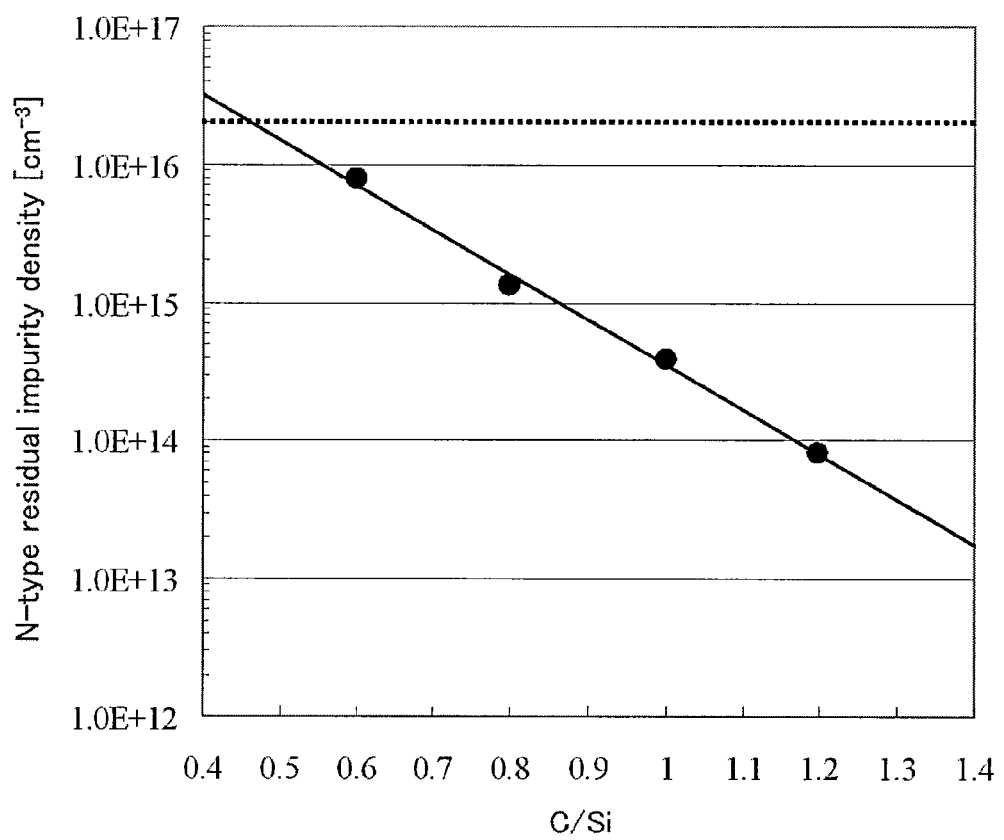
FIG. 13 is a diagram showing dependency of n-type residual impurity density in an epitaxial growth layer on C/Si ratio according to Embodiment 3 of the present invention.

Next, an investigation result of the n-type residual impurity density in the epitaxial growth layer of the above described epitaxial wafers by C-V measurement will be described. FIG. 13 is a diagram showing dependency of the n-type residual impurity density in the epitaxial growth layer on C/Si ratio in the above described experiments. As shown in FIG. 13, when C/Si ratio is set to be no less than 0.45, the n-type residual impurity density becomes no more than $2 \times 10^{16}$ cm$^{-3}$ and high quality in an electrical characteristic is proved to be realized. In addition, when C/Si ratio is set to be no less than 1.17, the n-type residual impurity density can be made no more than $1 \times 10^{14}$ cm$^{-3}$.

Meanwhile, when the epitaxial growth layer was formed at C/Si=1.4 by further increasing the C/Si ratio, the measurement was impossible because the C-V measurement device reached its measuring limit.

Therefore, in order to acquire a high quality epitaxial growth layer with low n-type residual impurity density, C/Si ratio is preferably to be set more than or equal to 0.45 and less than 1.4, and more preferably, C/Si ratio is to be set more than or equal to 1.17 and less than 1.4. Although the measurement was impossible in the experiments, it may be possible that the n-type residual impurity density is further decreased by setting C/Si ratio to be no less than 1.4.

As described above, in Embodiment 3 of the present invention, by setting the atomic ratio of carbon atom and silicon atom in all material gases supplied during the epitaxial growth, i.e. C/Si ratio, to be more than or equal to 0.45 and less than 1.4, the n-type residual impurity density in the epitaxial growth layer can be made no more than $2 \times 10^{16}$ cm$^{-3}$. This is especially effective when, for example, an n-type impurity is desired to be intentionally doped into the epitaxial growth layer at $10^{17}$ cm$^{-3}$ level or less.

Also, in Embodiment 3 of the present invention, by setting C/Si ratio to be more than or equal to 1.17 and less than 1.4, the n-type residual impurity density in the epitaxial growth layer can be made no more than $1 \times 10^{14}$ cm$^{-3}$. This is especially effective when, for example, an n-type impurity is desired to be intentionally doped into the epitaxial growth layer at $10^{15}$ cm$^{-3}$ level or less for a high voltage device.

Embodiment 4

In Embodiment 3 described above, a method of decreasing the n-type residual impurity density in the epitaxial growth layer by changing C/Si ratio of the supplying material gas has been described. Meanwhile, since the n-type residual impurity density also depends on the crystal growth temperature T2 at the epitaxial growth, experimental results of investigating the n-type residual impurity density when the epitaxial growth layer is formed with varying the crystal growth temperature T2 will be described in Embodiment 4.

A process flow for manufacturing the epitaxial wafer is similar to those in above described Embodiment 1 and Embodiment 3. That is, after the CMP process and the wet chemical cleaning process are first performed on the SiC bulk substrate, the SiC bulk substrate is introduced into the reactor of the CVD system. The high temperature annealing process is performed at the annealing temperature T1 for the annealing time t in the reducing gas atmosphere, and after the substrate temperature reduction process is performed and the temperature reaches the predetermined crystal growth temperature T2, the epitaxial growth is started by beginning the material gas supply. Here, the annealing temperature T1 was 1575 degrees C., and the annealing time t was 180 seconds.

Next, conditions in a low temperature epitaxial growth process will be described. A flow rate of silane diluted by 90% with hydrogen (i.e. a mixed gas of hydrogen to silane ratio being 9 to 1) is 90 sccm, and a flow rate of propane gas is 2.4 sccm, i.e. C/Si ratio was 0.8. The epitaxial growth was performed for each crystal growth temperature T2 of 1450, 1463, and 1475 degrees C.

Figure 14:
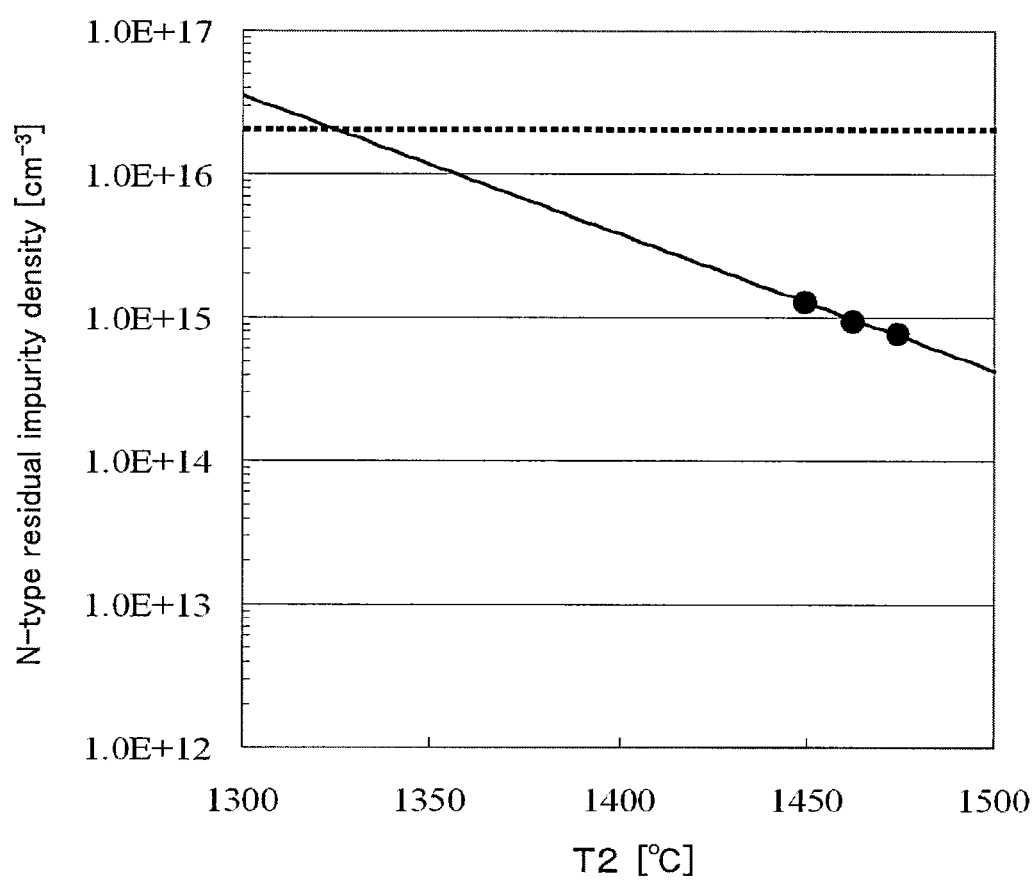
FIG. 14 is a diagram showing dependency of n-type residual impurity density in an epitaxial growth layer on a crystal growth temperature T2 according to Embodiment 4 of the present invention.

Next, an investigation result of the n-type residual impurity density in the epitaxial growth layer of the above described epitaxial wafers by C-V measurement will be described. FIG. 14 is a diagram showing dependency of the n-type residual impurity density in the epitaxial growth layer on the crystal growth temperature T2 in the above described experiments. As shown in FIG. 14, when the crystal growth temperature T2 is set to be no less than 1325 degrees C., the n-type residual impurity density is proved to be made no more than $2 \times 10^{16}$ cm$^{-3}$.

Meanwhile, when the crystal growth temperature T2 is increased to be no less than 1500 degrees C., manifestation of step bunching on the epitaxial growth layer surface occurs.

Therefore, by setting the crystal growth temperature T2 more than or equal to 1325 degrees C. and less than 1500 degrees C., the epitaxial growth layer having low defect density, good surface flatness, and also low n-type residual impurity density can be obtained.

Therefore, from the above described Embodiments 1 through 3 and Embodiment 4, it was proved that the epitaxial growth layer having low defect density, good surface flatness, and also low n-type residual impurity density can be obtained by the conditions described below. That is, after the bulk substrate is subjected to the high temperature annealing process at the annealing temperature T1 for the annealing time t in the reducing gas atmosphere and the substrate temperature reduction process, the epitaxial growth is started when the temperature reaches the predetermined crystal growth temperature T2, and C/Si ratio of the material gas supplied during the epitaxial growth is set to be more than or equal to 0.72 and less than 1.4, and the crystal growth temperature T2 is set to be more than or equal to 1325 degrees C. and less than 1500 degrees C.

As described above, in Embodiment 4 of the present invention, by setting the crystal growth temperature T2 more than or equal to 1325 degrees C. and less than 1500 degrees C., the n-type residual impurity density in the epitaxial growth layer can be made no more than $2\times10^{16}$ cm$^{-3}$. This is especially effective when, for example, n-type impurity is desired to be intentionally doped into the epitaxial growth layer at $10^{17}$ cm$^{-3}$ level or less.

Note that the experimental parameters such as C/Si ratio, the crystal growth temperature T2, or the growth speed may be appropriately combined at the epitaxial growth. In that case, an epitaxial growth layer having lower n-type residual impurity density may be obtained.

Embodiment 5

Figure 15:
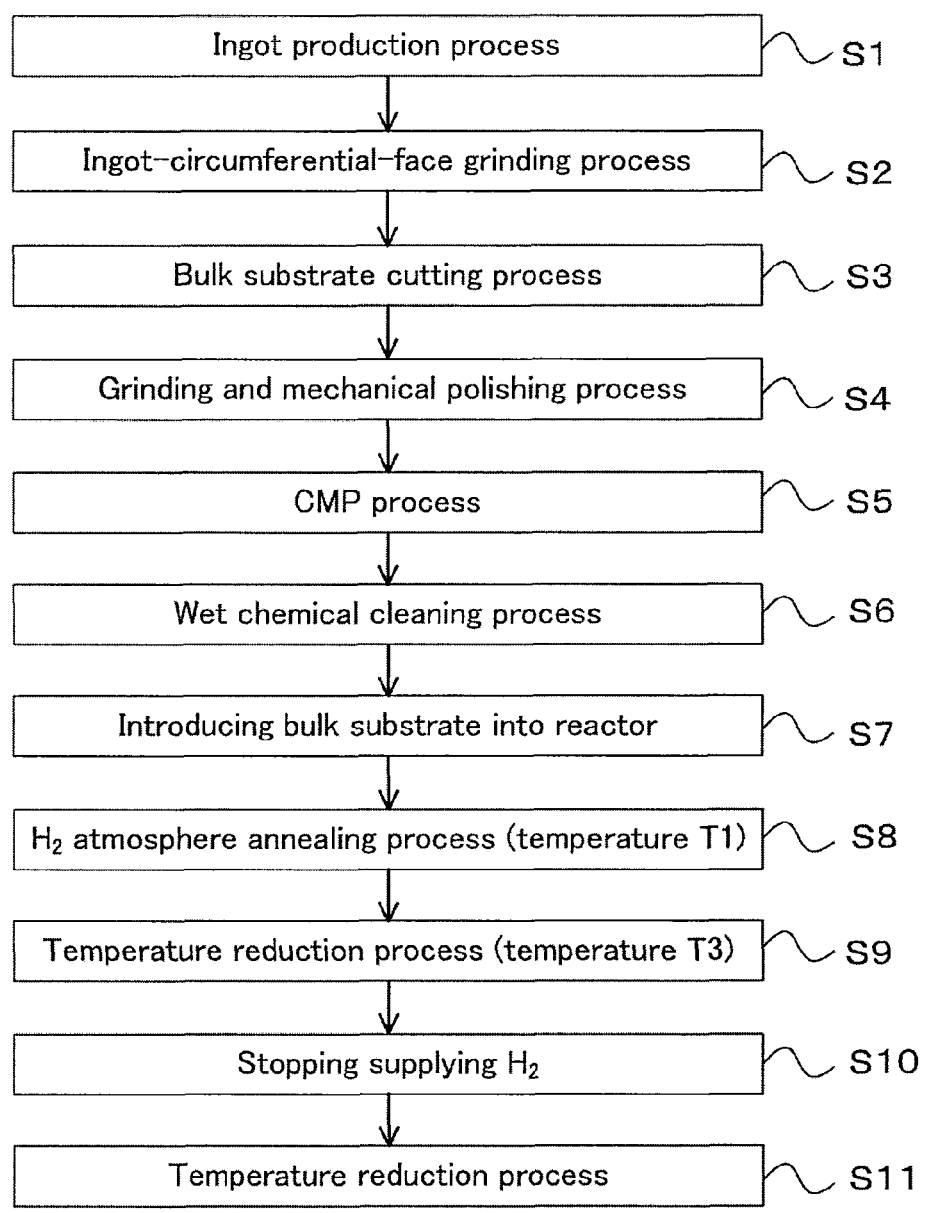
FIG. 15 is a flow chart showing a procedure for manufacturing a SiC bulk substrate for epitaxial growth according to Embodiment 5 of the present invention.

A method of manufacturing a SiC bulk substrate for epitaxial growth according to Embodiment 5 of the present invention is first explained. FIG. 15 is a flow chart showing a procedure for manufacturing a SiC bulk substrate for epitaxial growth according to Embodiment 5 of the present invention.

In SiC crystal, specific periodicity called as polytype exists. That is, while a stoichiometric ratio of Si and C is 1:1 and a crystal lattice has a hexagonal closest packing structure, there exists another kind of periodicity in an atomic arrangement along c-axis of the present structure. Physical properties of SiC are specified by a period in an atomic scale and symmetry of the crystal lattice. A type called 4H—SiC now receives the most attention from a standpoint of device application. In a power device using 4H—SiC, from a standpoint of mainly reducing a raw material cost, mainly used is an epitaxial wafer that has a top surface tilted no more than around 5 degrees in a <11-20> direction from a <0001> face and employing a face where Si atoms can be more stably arranged than C atoms.

Therefore, a SiC bulk substrate that is 4H—SiC type and has a specification of tilting no more than around 5 degrees in a <11-20> direction from a <0001> face is manufactured and used. Note that the tilting direction is not limited to the <11-20> direction, and the substrate may have a specification of tilting in another direction.

First, seed crystal and material are placed oppositely in a crucible. Both of them are heated with the material being relatively higher in temperature to make SiC single crystal grow on the seed crystal by using a sublimation method, so that a SiC ingot made of 4H—SiC is manufactured (S1). Next, by grinding the circumferential face of the SiC ingot, the SiC ingot is formed into a cylindrical shape (S2). Here, a process to define the face orientation of substrate, such as the so-called orientation flat process, is performed. The SiC ingot is then cut into flat plates, by a wire saw or wire electric discharge machining (S3). Next, the top and bottom surfaces of each of SiC bulk substrates cut into the flat plate shape are flattened by grinding, mechanical polishing and the like (S4). Here, circumferential edges of the substrate are beveled to prevent cracks of the substrate.

The SiC bulk substrate manufactured by the above processes has flaws or the like caused by mechanical polishing on its surfaces and these flaws serve as starting points to form defects during epitaxial growth. Therefore, applying only the above processes is not sufficient to obtain a satisfactory SiC epitaxial wafer.

Next, the SiC bulk substrate is flattened by Chemical Mechanical Polishing process (CMP) in which the SiC bulk substrate is mechanically polished and chemically polished by using chemical solution having an acid or alkaline property (S5). The SiC bulk substrate after the flattening process is subjected to ultrasonic cleaning by using acetone or the like, so that organic substances adhered to the top surface thereof will be removed. Next, mainly adhered metals are removed by immersing the SiC bulk substrate in mixed solution which is heated to be around 130 degrees C. (±5 degrees C.) and in which sulfuric acid and hydrogen peroxide solution are mixed in a volume ratio of 5:1. In addition, remaining adhered metals are removed by aqua regia.

Next, wet chemical cleaning called as RCA cleaning is performed on the SiC bulk substrate (S6). That is, after being immersed in mixed solution which is heated to be 75 degrees C. (±5 degrees C.) and in which ammonia water and hydrogen peroxide solution are mixed in 1:9, the substrate is immersed in mixed solution which is heated to be 75 degrees C. (±5 degrees C.) and in which hydrochloric acid and hydrogen peroxide solution are mixed in 1:9. Also, after being immersed in aqueous solution containing around 5% hydrofluoric acid in volume ratio, the SiC bulk substrate is subjected to top surface washing by performing substitution process with pure water. However, the SiC bulk substrate top surface cannot be made as clean as another semiconductor material such as silicon by a series of above described wet chemical cleaning with chemical solution. The reason is that, since inter-atomic force of SiC crystal is significantly stronger than inter-atomic force of conventional semiconductor, chemical solutions which uniformly dissolve the SiC bulk substrate top surface has not yet been found.

Figure 16:
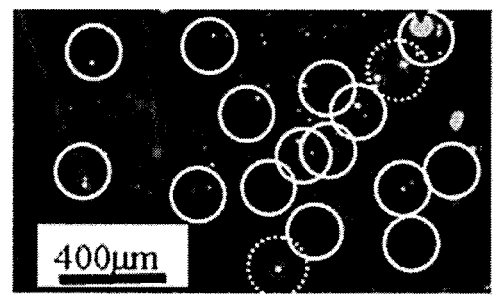
FIG. 16 is a dark field optical microscope image of the surface of a SiC bulk substrate on which wet chemical cleaning process according to Embodiment 5 of the present invention has been performed.

FIG. 16 is a dark field optical microscope image of the surface of a SiC bulk substrate on which the wet chemical cleaning process according to Embodiment 5 of the present invention has been performed. As will be described later, triangular defects are observed at areas enclosed with solid lines in FIG. 16 after epitaxial growth, while carrot defects are observed at areas enclosed with dotted lines. Relatively intense bright light is detected at the areas enclosed with the dotted lines, and relatively weak bright light is detected in the areas enclosed with the solid lines or at the neighboring outer areas thereof. It is noted that very intensely bright portion is a reflection of asperity of the bottom surface. Furthermore, while small punctiform bright portions are observed by precise observation, these portions do not affect the subsequent results. Since such an observation method is sensitive for top surface conditions, it is found that some micro particles are adhered to the SiC bulk substrate top surface by such an observation.

Figure 17:
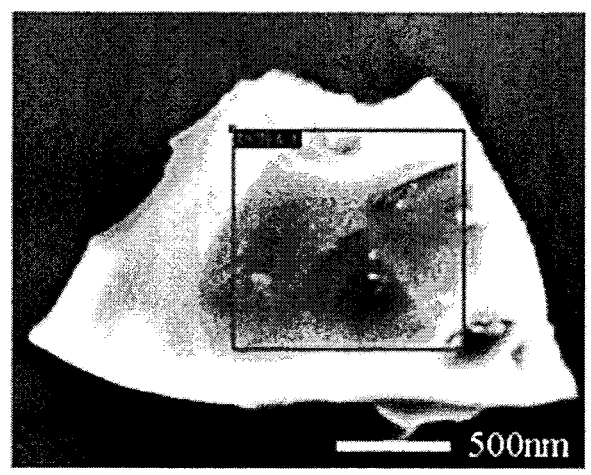
FIG. 17 is a scanning electron microscope image of a piece of SiC dust remaining on the surface of the SiC bulk substrate on which the wet chemical cleaning process according to Embodiment 5 of the present invention has been performed.

FIG. 17 is a scanning electron microscope image of a piece of SiC dust remaining on the surface of the SiC bulk substrate on which the wet chemical cleaning process according to Embodiment 5 of the present invention has been performed. As is clear from FIG. 17, a foreign substance present at the micro bright portion has sharp corners, and it is determined that the size thereof is at least at a micrometer scale.

Figure 18:
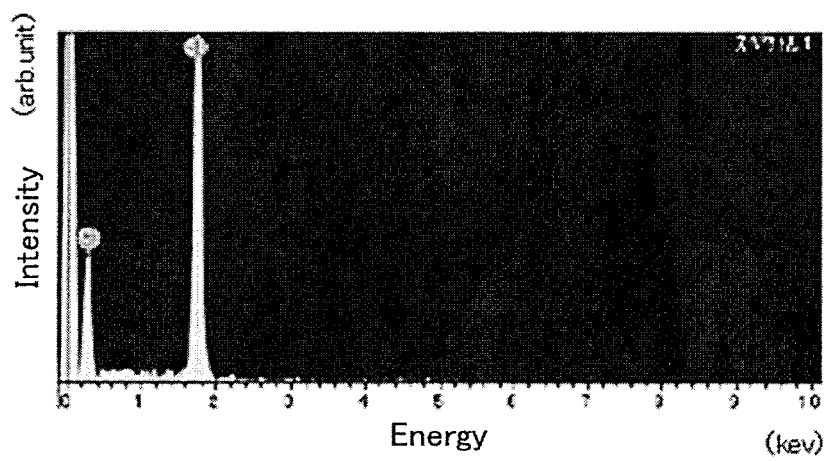
FIG. 18 is a spectrum resulting from an energy dispersive X-ray analysis of a square area in FIG. 17 in Embodiment 5 of the present invention.

FIG. 18 is a spectrum resulting from an energy dispersive X-ray analysis of an area enclosed with a square in FIG. 17 in Embodiment 5 of the present invention. In FIG. 18, a vertical axis represents spectral intensity and a horizontal axis represents energy. In FIG. 18, because there are strong peaks from carbon and silicon, it is understood that the foreign substance is composed of SiC having a stoichiometric ratio of 1:1 judging from relative strength of these peaks. That is, although performing above described various kinds of cleaning, it is proved that SiC dusts are still adhered to the SiC bulk substrate top surface.

Figure 19:
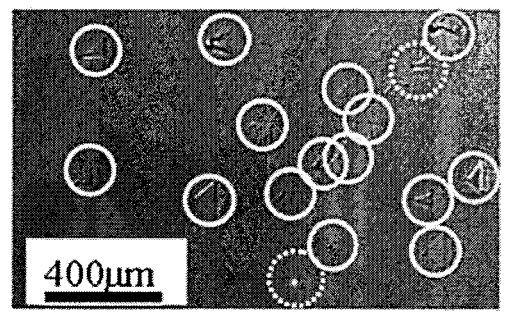
FIG. 19 is a Nomarski differential interference optical microscope image that is taken under a bright field observed after epitaxial growth about the same area as shown in FIG. 16 in Embodiment 5 of the present invention.

FIG. 19 is a bright field Nomarski differential interference optical microscope image that is taken under a bright field after epitaxial growth about the same area as shown in FIG. 16 in Embodiment 5 of the present invention. During the epitaxial growth, the temperature of the SiC bulk substrate was kept at 1475 degrees C. While treatment temperatures in experimental results acquired during processes leading to the present invention will be described in detail hereinafter, indicated values of such treatment temperatures strongly depend on a measurement method. Therefore, measured temperatures in the present invention are standardized by measured values of pyrometer in principle. Additionally, when a temperature is measured in another method, it may be adjusted by calculating an offset value from a value simultaneously measured by a pyrometer.

As is clear from FIG. 19, inventors of the present invention have found the fact for the first time that there is formed a leakage current defect such as the carrot defect at the neighborhood of the area enclosed with the dotted lines and the triangular defect at the neighborhood of the area enclosed with the solid line in FIG. 16. Also, while the positions where the relatively weak bright portions are detected in FIG. 16 do not completely correspond to the positions where the triangular defects are detected in FIG. 19 and there are seen some portions having deviations in some 100-μm level, this clearly shows a substantial movement in a process that will be described later.

Furthermore, when a power device has an area containing such defects, it is usually known that a leak current occurs when a high voltage is applied. That is, the existence of such defects becomes a direct factor to significantly reduce a yield of semiconductor devices. Therefore, there can never be acquired an epitaxial growth layer that has good uniformity and is preferable for manufacturing a power device without removing such defects.

In order to remove the SiC dusts which cause various kinds of defects, the inventors of the present invention have repeatedly performed various experiments by trial and error. As a result, the inventors have obtained a new knowledge that the SiC dusts can be removed most effectively by a series of processes described below in detail. The SiC dusts removing processes which characterize the present invention will be described hereinafter.

First, a SiC bulk substrate is placed on a graphite substrate holder coated by, for example, a SiC film, and placed in a reactor (S7). In order to prevent unintended molecular or atomic impurities remaining in the reactor from causing bad effects, the inside of the reactor is evacuated down to about $1 \times 10^{-7}$ kPa.

Figure 20:
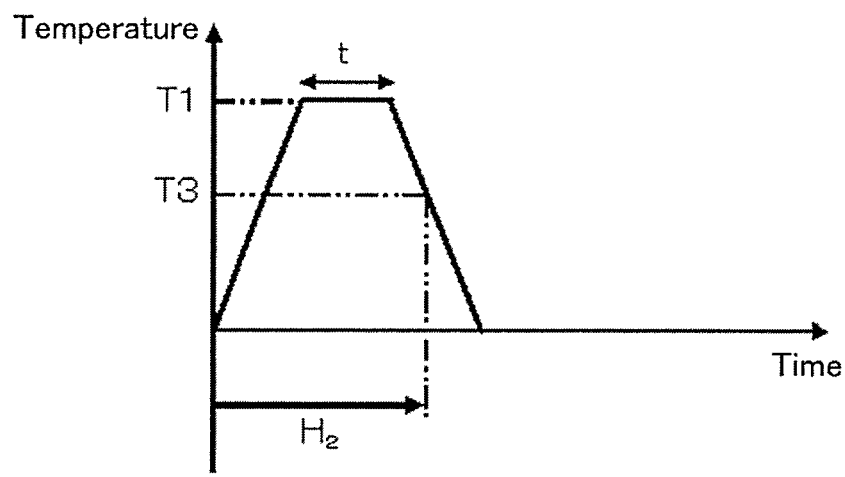
FIG. 20 is a diagram that shows the SiC bulk substrate's temperature changes in time and a gas sequence according to Embodiment 5 of the present invention.

FIG. 20 is a diagram that shows the SiC bulk substrate's temperature changes in time and a gas sequence according to Embodiment 5 of the present invention. In FIG. 20, the vertical axis represents temperature, and the horizontal axis represents time. Next, the SiC bulk substrate is processed according to the temperature profile and the gas sequence shown in FIG. 20.

First, a hydrogen gas, for example, is introduced into the reactor as a reducing gas. Here, the reducing gas is not limited to the hydrogen gas. Under a condition that the substrate top surface contacts the reducing gas after the introduction thereof, a reactor pressure is controlled so that a degree of vacuum is maintained constant, for example about 25 kPa. While an experimental example under the above mentioned pressure will be described in detail in this embodiment of the present invention, a preferable pressure of each of the reactors may be changeable in general depending on differences in reactor structures and shapes, etc., and a decompression atmosphere with a range from 1 kPa through 70 kPa is preferable if such differences are considered. The reasons are that substitution reaction efficiency by the reducing gas which will be described later is degraded when the pressure is lower than 1 kPa, and the flatness of the obtained epitaxial growth layer surface is degraded when the pressure is higher than 70 kPa because etching on the SiC bulk substrate becomes dominant.

Next, the SiC bulk substrate is heated to a predetermined treatment temperature T1 by mainly heating the substrate holder with a high frequency induced current. The temperature T1 is set to a relatively high temperature, for example a temperature 1550 degrees C. or higher, and the temperature is kept in a reducing gas atmosphere for a treatment time t (S8).

Next, in the reducing gas atmosphere, the temperature of the SiC bulk substrate is reduced with the pressure kept constant. In the view point of reducing gas cost, it is advantageous to stop supplying the reducing gas before the temperature of the SiC bulk substrate reaches room temperature. Therefore, at a time point when the temperature of the SiC bulk substrate reduces and reaches a predetermined temperature T3 lower than the temperature T1 (S9), the supply of the reducing gas is stopped (S10), and then the temperature of the SiC bulk substrate is further reduced to room temperature lower than the temperature T3 (S11). By the processes described above, the SiC bulk substrate for epitaxial growth is completed.

When the epitaxial growth process is performed without performing the annealing process at the high temperature, it is known that leakage current defects such as the carrot defects and the triangular defects are generated at high density of at least no less than 10 pieces/cm$^2$.

As described above, since the generation of the carrot defects and the triangular defects are mainly caused by the SiC dusts adhered to the SiC bulk substrate, the process in a reducing gas atmosphere for annealing the SiC dusts chemically adhered to the SiC bulk substrate is very effective in order to selectively remove the SiC dusts without damaging the SiC bulk substrate itself.

That is, the SiC dusts are speculated to be adhered to the SiC bulk substrate in the hydrofluoric acid solution used at the last stage of the above described process with chemical solution. The hydrofluoric acid treatment is originally for removing an oxide film on the SiC surface. Therefore, no oxide film is formed in the hydrofluoric acid solution both on the SiC bulk substrate and the adhered SiC dusts. When the SiC bulk substrate which has been immersed in the hydrofluoric acid solution is exposed to the atmosphere, oxidation on both surfaces of the SiC bulk substrate and the adhered SiC dusts immediately starts. Because the SiC dust surface is not flat judging from the SiC dust shape, the SiC dust is speculated to be adhered to the SiC bulk substrate through a thin oxide film. Therefore, in order to selectively remove the SiC dust from the substrate top surface without damaging the SiC bulk substrate, stabilizing process is very effective in which the both surfaces are hydrogen-substituted by hydrogen atoms, for example, contained in the reducing gas after removing the both oxide films by the annealing process in a reducing gas atmosphere. This is because, by such a process, the both surfaces are hydrogen terminated with each other resulting in generation of an electrochemical repulsive force between the both and, in addition, the SiC dusts can be moved from the SiC bulk substrate top surface to a downstream side of the gas by a gas flow itself. As a result, the SiC dusts adhered to the SiC bulk substrate top surface are removed without damaging the SiC bulk substrate at all.

However, if the temperature T3 at which to stop supplying the reducing gas is too high, surface atoms of the SiC bulk substrate are terminated with atoms other than, for example, hydrogen atoms contained in the reducing gas, or an oxidized layer is formed by the formation of surface dangling bonds. If these facts are taken into consideration, a temperature of 900 degrees C. or lower is suitable for the SiC bulk substrate's temperature T3 at which to stop supplying the reducing gas, and a temperature of 300 degrees C. or lower is more suitable. The reason why the temperature of 300 degrees C. or lower is suitable is that the surface atoms in the SiC bulk substrate are completely terminated with atoms, for example hydrogen atoms, contained in the reducing gas, and in order to effectively manufacture the substrate, the reduction rate of the substrate's temperature can also be increased, so that effective temperature reduction can be realized in a short time.

In addition, it is desirable that the time required for the temperature reduction process is shorter. It is because in a case where the time required for the temperature reduction process is long, there sometimes occurs a phenomenon in which SiC dust or the like that adheres to the inside of the reactor and remains therein newly adheres to the surface of the SiC bulk substrate cleaned through the above annealing process to serve as an abnormal growth nucleus during epitaxial growth, forming an leakage current defect.

As a result of experiments that the inventors of the present invention have repeatedly performed under various conditions, the inventors have found that the hydrogen substitution described above occurs effectively at an annealing temperature of 1525 degrees C. or higher. That is, it can be said that the temperature of 1525 degrees C. is the lowest temperature at which an annealing effect arises effectively. Explained below is the result of experiments in which the epitaxial growth process is performed on SiC bulk substrates for epitaxial growth that are annealed with the temperature T1 varied to examine the densities of carrot defects and triangular defects.

Figure 21:
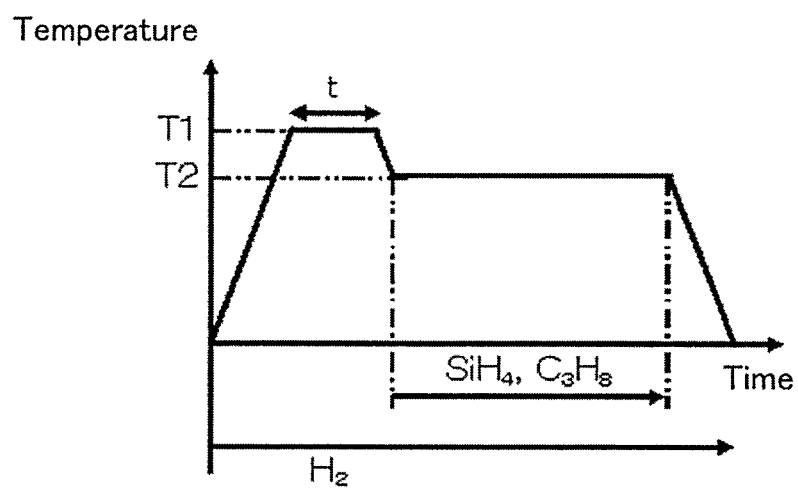
FIG. 21 is a diagram showing the SiC bulk substrate's temperature changes in time and a gas sequence, according to Embodiment 5 of the present invention, that are used for experiments in which epitaxial growth is performed after an annealing process.

FIG. 21 is a diagram showing the SiC bulk substrate's temperature changes in time and a gas sequence, according to Embodiment 5 of the present invention, that are used for experiments in which epitaxial growth is performed after annealing In the explanation described above, the SiC bulk substrate temperature is to be reduced to room temperature after annealing; however, after the annealing process, there is no resultant difference on the effect between a procedure in which epitaxial growth is performed by reducing to room temperature and then re-heating to a temperature for epitaxial growth, and a procedure in which epitaxial growth is performed by adjusting, without reducing to room temperature, to the epitaxial growth temperature. Therefore, in order to shorten the process time, epitaxial growth was performed, as shown in FIG. 21, by adjusting, without reducing to room temperature after annealing, to the epitaxial growth temperature.

The processes from manufacturing an ingot to annealing are the same as those described above. After the annealing process, the SiC bulk substrate's temperature is reduced, without stopping supplying the reducing gas, to a temperature T2 for epitaxial growth, and then supply of a material gas such as silane ($SiH_4$) or propane ($C_3H_8$) is started. Epitaxial growth is started by supplying the material gas. The SiC bulk substrate' temperature is kept constant at the temperature T2 during the epitaxial growth. A case in which the material gas is supplied after the SiC bulk substrate's temperature is reduced to the epitaxial growth temperature T2 has been described; however, in order to shorten the entire process time, the material gas supply may be stared before the SiC bulk substrate's temperature reaches the temperature T2.

After an epitaxial growth layer having a predetermined thickness is formed, the material gas supply is stopped. The temperature of a SiC epitaxial wafer, i.e., the SiC bulk substrate on which the epitaxial growth layer forms, is reduced to room temperature, and then the reducing gas supply is stopped. The reducing gas supply may be stopped at a time point when the wafer temperature reaches the temperature T3 described above.

In addition, as described above, the annealing process can be performed in a CVD system for SiC epitaxial growth; however, SiC dust or the like that adheres to the inside of the CVD system and remains therein newly adheres to the surface of the SiC bulk substrate cleaned by the high temperature annealing process, to serve as abnormal growth nucleuses during the epitaxial growth step, sometimes causing a problem to form new leakage current defects.

What is particularly-problematic is the SiC powder dusts adhered on the surface of components located in a direction from which the reducing gas, material gas, or the like flows over the SiC bulk substrate, and components such as the substrate holder and the susceptor that configure a heating area of the upper surface opposite to the SiC bulk substrate. Such SiC powder dusts are formed on the members concurrently with the SiC epitaxial growth on the SiC bulk substrate, and generated by adhering to the SiC bulk substrate. Therefore, it is very difficult to prevent the formation of SiC powder dusts themselves. Also, changing all of the members every time performing the epitaxial growth is disadvantageous from a standpoint of manufacturing cost. Therefore, while the epitaxial wafers are repeatedly manufactured, since the SiC powder dusts adhered to the members heated in the CVD system are adhered to the SiC bulk substrate top surface once purified by the annealing process, it is preferable that the annealing process and the epitaxial growth process are performed in separate apparatuses.

Here, in a case of using the temperature profile and the gas sequence shown in FIG. 21, under conditions of the annealing temperature T1 varied in steps of 25 degrees C. from 1525 degrees C. to 1600 degrees C. and the annealing times t of 10 seconds, 180 seconds, and 420 seconds, total defect densities of carrot defects and triangular defects observed and counted on the surfaces through an optical microscope are shown in Table 2. Other conditions were as follows. The temperature T2 for epitaxial growth was 1475 degrees C., flow rates of the material gases were 90 sccm for a 90 percent hydrogen diluted silane and 2.4 sccm for propane, and the thickness of the epitaxial growth layer was 6 μm.

TABLE 2

| | Annealing temperature (degree C.) | | | |
|---|---|---|---|---|
| Time (second) | 1525 | 1550 | 1575 | 1600 |
| 10 | — | 3.3 pieces/cm$^2$ | 1.4 pieces/cm$^2$ | 0.83 pieces/cm$^2$ |
| 180 | — | 2.3 pieces/cm$^2$ | 0.70 pieces/cm$^2$ | 2.6 pieces/cm$^2$ |
| 420 | 3.1 pieces/cm$^2$ | 0.97 pieces/cm$^2$ | 3.0 pieces/cm$^2$ | >30 pieces/cm$^2$ |

When the annealing temperature T1 is set to be 1525 degrees C., the defect density at the annealing treatment time t of 420 seconds is 3.1 pieces/cm$^2$ and it is decreased to one third or less compared to a case in which the annealing process is not performed. When the annealing temperature T1 is set to be 1550 degrees C., the defect density is no more than 3 pieces/cm$^2$ at the annealing treatment time t of no less than 180 seconds. Also, when the annealing temperature T1 is set to be 1575 degrees C., a result of 0.7 pieces/cm$^2$ is obtained at the annealing treatment time t of 180 seconds. When the annealing temperature T1 is set to be 1600 degrees C., while good results of 0.83 pieces/cm$^2$ at the annealing treatment time of 10 seconds and 2.6 pieces/cm$^2$ at 180 seconds are obtained, the density is rapidly deteriorated to more than 30 pieces/cm$^2$ at 420 seconds.

Realization of lowering the defect density with relatively short time period by increasing the annealing temperature T1 is coincident with the general knowledge that the chemical reaction is accelerated at high temperature. However, when the annealing temperature T1 is 1600 degrees C., the triangular defect density is increased at the annealing treatment time of 420 seconds. The reason seems to be that etching of the SiC bulk substrate top surface with the reducing gas becomes dominant in addition to desorption of the SiC dusts. In other words, because SiC droplet is formed by over etching of the SiC bulk substrate with the reducing gas or part of the SiC dusts themselves are dissolved on the SiC bulk substrate and unified with the SiC bulk substrate, good flatness acquired by the CMP process is locally deteriorated. As a result, such deterioration generates new abnormal growth nucleuses.

Therefore, from a standpoint of working hours efficiency, an annealing temperature T1 of no less than 1550 degrees C. is preferable and no less than 1575 degrees C. is more preferable. When the annealing temperature T1 is 1550 degrees C., the annealing treatment time t of no less than 420 seconds is desirable. When the annealing temperature T1 is 1575 degrees C., the annealing treatment time t of no more than 420 seconds, or more preferably of 180 seconds, is desirable. When the annealing temperature T1 is 1600 degrees C., the annealing treatment time t of less than 180 seconds, or around 10 seconds, is desirable. As shown in a series of experimental results, as the annealing temperature T1 increases, the annealing time t tends to decrease. In addition, while a case is described here in which the annealing temperature T1 is kept constant throughout the annealing treatment time t, the annealing temperature T1 may have time variation instead of keeping it constant in order to shorten the treatment time. In that case, a peak temperature corresponds to the above described annealing temperature T1.

Figure 22:
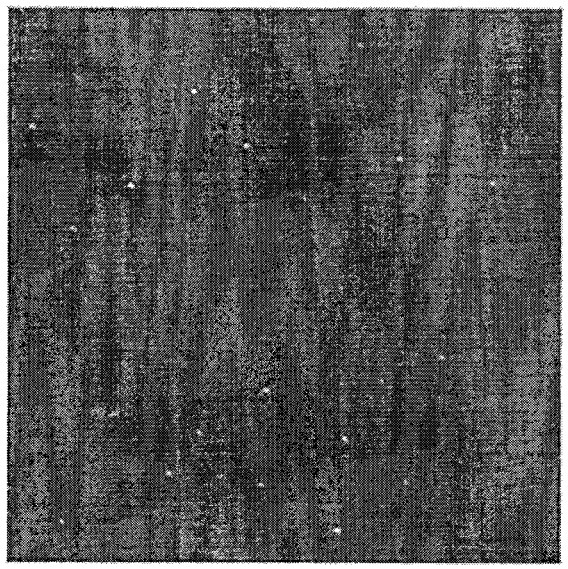
FIG. 22 is an atomic force microscope image of a 10 µm square area on the SiC epitaxial wafer according to Embodiment 5 of the present invention.

Next, an explanation is made for examination results of the surface flatness of the SiC epitaxial wafer obtained using the temperature profile and the gas sequence shown in FIG. 21. FIG. 22 is an atomic force microscope image of a 10 μm square area on the SiC epitaxial wafer according to Embodiment 5 of the present invention. The observed SiC epitaxial wafer was produced under the condition of an annealing temperature T1 of 1550 degrees C. and a treatment time t of 420 seconds.

In a case where epitaxial growth is performed for a 4H—SiC SiC bulk substrate whose top surface is tilted less than around 5 degrees from <0001> face toward <11-20> direction so that Si atoms are placed more stably than C atoms, there exists a strong tendency that a substantially periodic asperity having a periodicity of over a micrometer order, called as step bunching, forms along <11-20> direction. When a step bunching exists, electric carriers induced in the vicinity of the epitaxial growth layer surface by the electric field or the like directly serve as a potential barrier when the induced carriers move in a plane parallel to the surface and in directions not parallel to the step bunching. Thus, this lowers a mobility, i.e., the electric conductivity, to degrade the device characteristics. For this reason, the existence of a step bunching causes a problem in that the electric conductivity uniformity is lowered in the epitaxial wafer faces. Therefore, the existence of a step bunching greatly restricts the degree of freedom in designing and manufacturing a detailed structure of devices such as MOS devices in which electric carriers are induced in the vicinity of the epitaxial growth layer surface.

In a case where epitaxial growth is performed on the SiC bulk substrate for epitaxial growth that is annealed according to Embodiment 5 of the present invention, it is found, as shown in FIG. 22, that the asperity having the periodicity of a micrometer order does not appear and the obtained epitaxial growth layer has a good surface flatness without the step bunching.

The procedure according to Embodiment 5 of the present invention has an effect in that by processing as described above, foreign substances such as SiC dust adhered on a SiC bulk substrate can be removed, and without performing any other process after that, the obtained SiC bulk substrate is one having a clean surface on which a high quality epitaxial growth layer is to be manufactured so as to have a very low density in defects formed during epitaxial growth. Furthermore, the step bunching can be prevented from being formed during epitaxial growth, so that an epitaxial growth layer satisfactory in its flatness can be formed.

Embodiment 6

In Embodiment 5 of the present invention described above, dependency of the SiC bulk substrate surface condition on the annealing temperature has been described in detail. In the annealing process, the annealing temperature T1 and the treatment time t are generally the important factors. That is, as to the effect of the annealing process on the SiC bulk substrate, these two parameters should be considered concurrently. It can be said in general that degree of heat treatment becomes larger as the annealing temperature becomes higher and the treatment time becomes longer. That is, T1×t, i.e. product of the annealing temperature T1 and the treatment time t, directly represents the degree of heat treatment. Also, as described above, the experimental results in Table 2 also suggest that the optimal treatment time t changes depending on the annealing temperature T1. That is, in principle, there is a tendency that, when the annealing temperature T1 becomes higher, defect density decreases as the treatment time t becomes shorter.

While the treatment time itself may be simply applied as the treatment time t, as to the annealing temperature T1, it is more appropriate to introduce a standardized temperature, i.e., (T1−To), by setting an offset temperature To at which the annealing effect appears, rather than directly applying the actual annealing temperature T1. That is, (T1−To)×t is considered to represent the degree of heat treatment. Note that its unit is represented as K·s.

Figure 23:
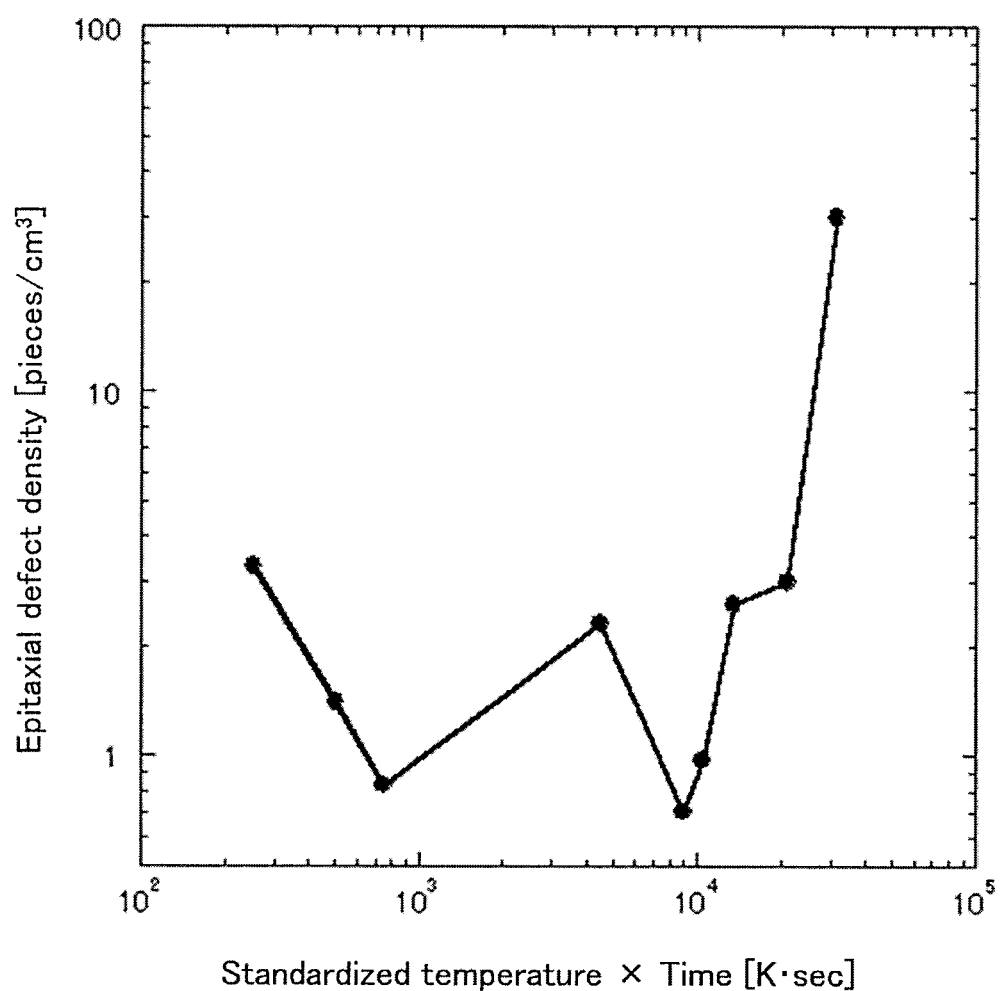
FIG. 23 is a figure showing a relation between densities of epitaxial defects and "standardized temperature×time" in Embodiment 6 of the present invention.

FIG. 23 is a figure showing a relation between densities of epitaxial defects (epi defects) and "standardized temperature×time" in Embodiment 6 of the present invention. In FIG. 23, the horizontal axis represents "standardized temperature× time" as calculated values, i.e. (T1−To)×t, from annealing temperatures T1 and treatment times t shown in Table 2, and the vertical axis represents defect density in the respective conditions. In addition, the offset temperature To has been set to be 1525 degrees C. which is the lowest annealing temperature at which the annealing effect appears.

It is understood from FIG. 23 that practically usable wafers having a defect density of 3.3 pieces/cm$^2$ or less have been obtained in a "(T1−To)×t" range of 0 to 21000. In a range of 500 to 13500, a more favorable result of 2.6 pieces/cm² or less is obtained.

In Embodiment 6 of the present invention, the parameter described above has been introduced. This brings an effect that if a certain favorable range is found from experimental results of above described Table 2 level without conducting comprehensive experiments in all conditions, the obtained result can directly derive a favorable treatment time t when the annealing temperature T1 is varied or a favorable annealing temperature T1 for a desired constant treatment time t.

Embodiment 7

In Embodiments 5 and 6 of the present invention, explanation has been made for the results of experiments conducted under a time saving condition, as shown in FIG. 21, that epitaxial growth is performed at a crystal growth temperature T2 without reducing the temperature to room temperature after the annealing. On the other hand, in Embodiment 7 of the present invention, explanation is made for the result of an experiment conducted under a condition that the temperature of a SiC bulk substrate is reduced to room temperature after annealing and then epitaxial growth is performed.

Figure 24:
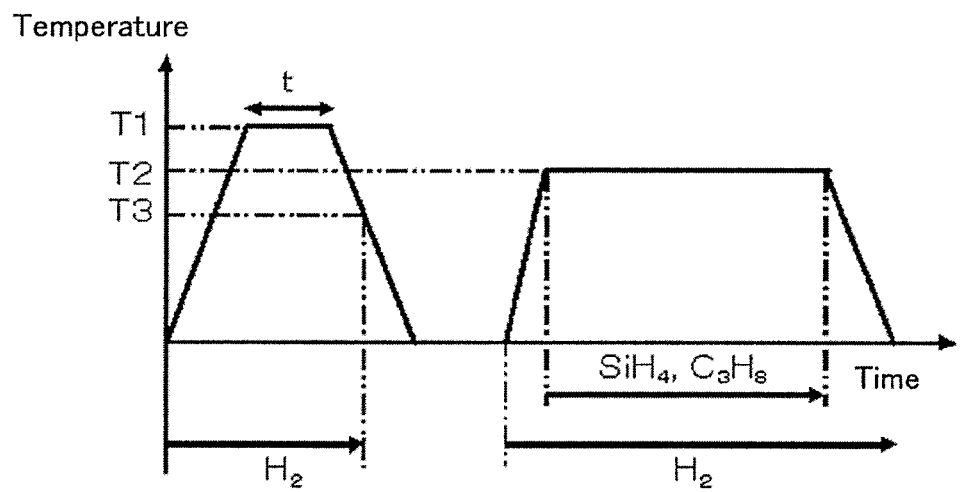
FIG. 24 is a diagram showing the SiC bulk substrate's temperature changes and a gas sequence used for an experiment in which epitaxial growth is performed after the annealing process, according to Embodiment 7 of the present invention.

FIG. 24 is a diagram showing a SiC bulk substrate's temperature changes and a gas sequence used for the experiment in which epitaxial growth is performed after annealing, according to Embodiment 7 of the present invention. The processes from an ingot manufacture process (Si) to a temperature reduction process (S11) for reducing the temperature to room temperature below a temperature T3 are the same as those in Embodiments 5 and 6 of the present invention.

The specific condition for annealing was that the annealing temperature T1 is 1575 degrees C., and the annealing time t is 180 seconds. The annealing effect occurs at a temperature To of 1525 degrees C., thus (T1−To)×t=9000.

As shown in FIG. 24, after the annealing, the supply of hydrogen gas serving as a reducing gas was stopped at a time point at which the SiC bulk substrate's temperature is reduced to a temperature T3=100 degrees C. Then, the pressure inside the system was made back to the atmospheric pressure, and the SiC bulk substrate was exposed to the atmosphere to reduce its temperature. Then, the SiC bulk substrate was kept at a room temperature, more specifically at 30 degrees C. or below, i.e. at about 25 degrees C. in this case for 60 minutes.

After keeping the SiC bulk substrate at the room temperature for 60 minutes, the substrate's temperature was increased again to a crystal growth temperature T2 and then epitaxial growth was performed. Specific conditions for this epitaxial growth are the same as those in Embodiments 5 and 6 of the present invention; the crystal growth temperature T2 was 1475 degrees C., flow rates of the material gases were 90 sccm for a 90 percent hydrogen diluted silane (i.e., a gas mixture with a ratio of hydrogen:silane=9:1) and 2.4 sccm for propane, and the thickness of the epitaxial growth layer was 6 μm.

After this experiment, the same evaluation as that in Embodiments 5 and 6 was performed about defects on the epitaxial wafer's surface, i.e., the epitaxial defect density, giving a result of a defect density of 0.7 pieces/cm². This result is equivalent to that of Embodiment 5.

Another epitaxial wafer was manufactured in a condition that the annealing temperature T1 is 1550 degrees C., the annealing time t is 10 seconds, and the rest of the conditions were the same as those described above. The evaluation of the epitaxial defect density indicated a defect density of 0.33 pieces/cm².

These facts described above further clearly indicated that an epitaxial wafer having a low defect density and a good surface flatness can be obtained even by producing in a manner shown in FIG. 24 in which after the SiC bulk substrate is annealed, the inside pressure is made back to the atmospheric pressure to expose the substrate to the atmosphere and reduce the substrate's temperature to room temperature, and then the temperature of the substrate is increased again to perform epitaxial growth. That is, it further clearly indicates that even if the keeping process is performed in which the annealed SiC bulk substrate is exposed to the atmosphere so that the substrate's temperature is reduced to room temperature, without requiring any other process after that, the obtained SiC bulk substrate is one having a clean surface on which a high quality epitaxial growth layer is to be manufactured so as to have a good surface flatness and a very low density in defects formed during epitaxial growth.

Embodiment 8

Figure 25:
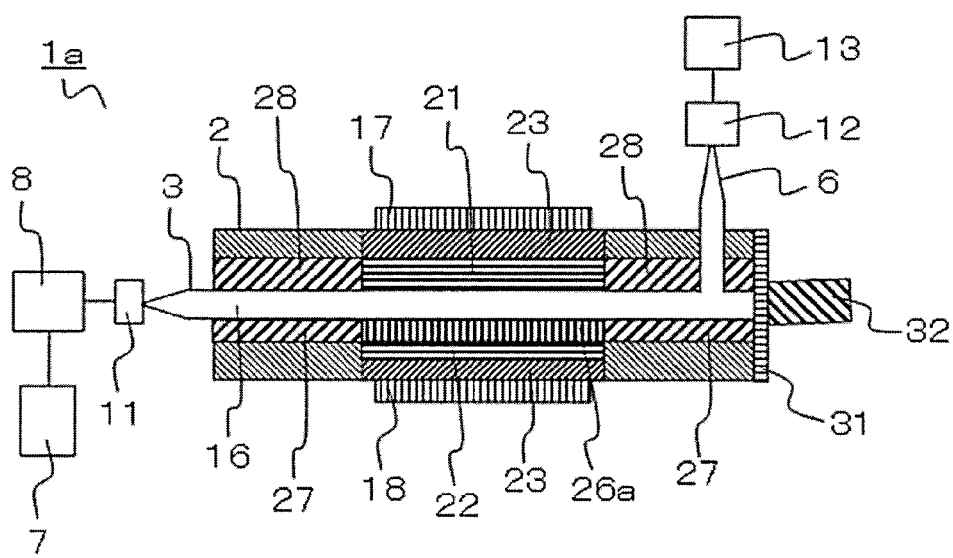
FIG. 25 is a cross sectional side view showing a heat treatment apparatus according to Embodiment 8 of the present invention.

The configuration of a heat treatment apparatus 1a according to Embodiment 8 of the present invention will be described first. FIG. 25 is a sectional side view showing the heat treatment apparatus 1a according to Embodiment 8 of the present invention.

Referring to FIG. 25, the heat treatment apparatus 1a includes a treatment chamber 2 for heat-treating a SiC bulk substrate. Connected to the side face of the treatment chamber 2 is an introducing nozzle 3 that serves as a reducing-gas introduction portion for introducing reducing gas into the treatment chamber 2, while, connected to the upper face of the treatment chamber 2 is an exhaust nozzle 6 that serves as a reducing-gas exhaust portion for exhausting the reducing gas from the treatment chamber 2. The reducing gas to be supplied from a reducing-gas supply source 7 is introduced, through a reducing-gas purification equipment 8 for eliminating mixed impurity gas components, via a valve 11, through the introducing nozzle 3 and then into the treatment chamber 2. An exhaust pump 12 is connected to the exhaust nozzle 6, thereby enabling the treatment chamber 2 to be evacuated. The reducing gas, exhausted to the outside of the treatment chamber 2, is processed by a reducing-gas abatement device 13.

The treatment chamber 2 will be described next. Preferably, at least an external surface portion of the treatment chamber 2 is formed of a heat-resistant material such as a material including quartz. Formed within the treatment chamber 2 is a reducing-gas flow path 16, through which the gas flows from the introduction nozzle 3 to the exhaust nozzle 6.

On outer surfaces in the neighborhood of the central portion of the treatment chamber 2, induction heating coils 17 and 18, each serving as a heating device, are disposed facing each other across the treatment chamber 2. When the induction heating coils 17 and 18 themselves become high in temperature, the temperatures in their neighboring areas increase. To prevent occurrence of the high temperature, the induction heating coils 17 and 18 preferably have a tube for cooling water. Within the treatment chamber 2 located between the induction heating coils 17 and 18, an upper susceptor 21 and a lower susceptor 22 are disposed facing each other. An heat insulating material 23 is disposed between the upper susceptor 21 and the induction heating coil 17 and between the lower susceptor 22 and the induction heating coil 18. Disposed on the lower susceptor 22 is a substrate holder 26a, serving as a substrate supporter for supporting the SiC bulk substrate.

Here, the substrate holder 26a is disposed so as to be in contact with the reducing-gas flow path 16. When the substrate holder 26a is disposed in this way, a structural stepped surface is formed in the reducing-gas flow path 16 by means of an inner wall of the treatment chamber 2 and the substrate holder 26a. In order to reduce the structural stepped surface, stepped surface reduction members 27 are adjacently disposed upstream and downstream of the substrate holder 26a with respect to the direction in which the reducing gas flows. The upper susceptor 21 is also disposed so as to be in contact with the reducing-gas flow path 16, and thereby a structural stepped surface is formed in the reducing-gas flow path 16 by means of an inner wall of the treatment chamber 2 and the upper susceptor 21; thus, stepped surface reduction members 28 are adjacently disposed upstream and downstream of the upper susceptor 21 with respect to the direction in which the reducing gas flows.

On the side face of the substrate holder 26a located downstream of the substrate 26a with respect to the direction in which the reducing gas flows, a take out door 31 is disposed openably and closably, thereby allowing for putting in and taking out the substrate holder 26a. By fitting an O-ring or the like to the take out door 31, the air-tightness within the treatment chamber 2 can be maintained. Note that since the substrate holder 26a is put in and taken out in atmospheric pressure, the take out door 31 may be fitted with a leakage valve.

Further, the take out door 31 is fitted with a temperature measurement device 32 such as a pyrometer for measuring temperatures of the substrate holder 26a or its neighboring area. When the pyrometer is employed as the temperature measurement device 32, the take out door 31 is provided with a view port that is formed of a material with high transmittance of a wavelength used by the pyrometer.

Figure 26:
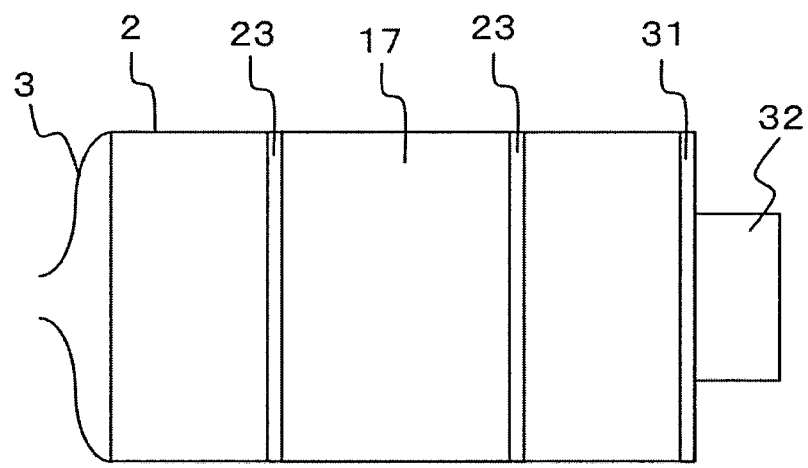
FIG. 26 is a top plan showing the heat treatment apparatus according to Embodiment 8 of the present invention.

The introduction nozzle 3 will be described next. FIG. 26 is a top plan showing the heat treatment apparatus 1a according to Embodiment 8 of the present invention. In FIG. 26, however, the valve 11, the reducing-gas purification device 8, the reducing-gas supply source 7, the exhaust nozzle 6, the exhaust pump 12 and the reducing-gas abatement device 13 are not shown. In order to prevent a turbulent flow from occurring in the reducing gas introduced through the introduction nozzle 3 into the treatment chamber 2, the introduction nozzle 3 is preferably shaped to minimize shapes of a steep angle and a straight line. Specifically, as shown in FIG. 26, the introduction nozzle 3 is formed by curves each having at least a point of inflection, thereby preventing a turbulent flow from occurring in the reducing gas.

Figure 27:
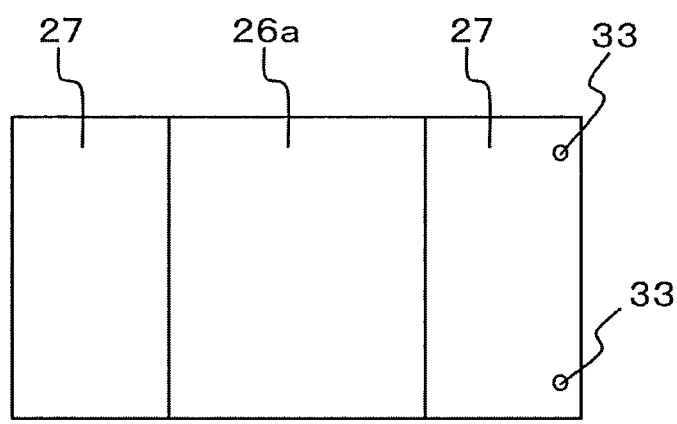
FIG. 27 is a top plan showing a substrate holder and stepped surface reduction members according to Embodiment 8 of the present invention.

The stepped surface reduction members 27 and 28 will be described next. FIG. 27 is a top plan showing the substrate holder 26a and the stepped surface reduction members 27 according to Embodiment 8 of the present invention. Preferably, the stepped surface reduction members 27 are formed of a substance that is maximally difficult to influence electro-conductivity of the SiC bulk substrate to be processed. Preferably, the substance is employed which minimally contains a substance, such as aluminum and nitrogen, that influences the electro-conductivity of the SiC bulk substrate. Further, because the reduction members are estimated to become high in temperature, preferably a heat insulating material is used to form the reduction members. Further, the stepped surface reduction members 27 each may be formed in such a way that the body portion is formed using the heat insulating material, and the surface of the body portion is coated with a layer of, for instance, SiC, TaC, or graphite (carbon) that is difficult to influence the electro-conductivity of the SiC bulk substrate. The same holds for the stepped surface reduction members 28.

The stepped surface reduction members 27 are members of plate type, as shown in FIGS. 25 and 27, and formed to have a width in the direction perpendicular to the plane of FIG. 25, i.e., in a longitudinal direction in FIG. 27 so as to be substantially the same as that of the substrate holder 26a and a thickness so as to maximally reduce the structural stepped surface that is formed in the reducing-gas flow path 16 by means of the substrate holder 26a and the inner wall of the treatment chamber 2. In other words, a surface of the substrate holder 26a in contact with the reducing-gas flow path 16 and surfaces of the stepped surface reduction members 27 in contact with the reducing-gas flow path 16 are present on substantially the same plane. In addition, preferably the substrate holder 26a is disposed in a contact relationship with the stepped surface reduction members 27 so that a minimum clearance is created therebetween. In other words, preferably the structural stepped surface in the reducing-gas flow path 16 is maximally reduced by disposing the stepped surface reduction members 27. Doing this way can prevent the turbulent flow from occurring in the reducing gas introduced into the treatment chamber 2.

From a viewpoint of handling, preferably the substrate holder 26a and the stepped surface reduction members 27 are mechanically coupled to each other. When they are mechanically coupled together, it will suffice that fitting parts for take-out, 33, are provided, as shown in FIG. 27, to one of the stepped surface reduction members 27, located downstream with respect to the direction in which the reducing gas flows. Specifically, the take-out fitting parts 33 represent through-holes or protruding parts, for instance. By using them, when the substrate holder 26a and the stepped surface reduction members 27, mechanically coupled together, are put in and taken out from the take out door 31, efficiency in handling is improved. Note that an example of providing two take-out fitting parts 33 is shown in FIG. 27, but the present invention is not limited to this, and it will suffice if at least one or more parts are provided thereto.

The stepped surface reduction member 28, disposed adjacent to the upper susceptor 21, is also a member of plate type, as with the stepped surface reduction member 27. The width of the reduction member 28 in the direction perpendicular to the plane of FIG. 25 is substantially the same as that of the upper susceptor 21. The reduction member is formed to have a thickness such as to maximally reduce the structural stepped surface that is formed in the reducing-gas flow path 16 by means of the upper susceptor 21 and the inner wall of the treatment chamber 2. In other words, a surface of the upper susceptor 21 in contact with the reducing gas flow path 16 and a surface of the stepped surface reduction member 28 in contact with the reducing-gas flow path 16 are present on substantially the same plane. In addition, preferably the upper susceptor 21 is disposed in a contact relationship with the stepped surface reduction member 28 so that a minimum clearance is provided therebetween. In other words, preferably the stepped surface in the reducing-gas flow path 16 is maximally reduced by disposing the structural stepped surface reduction member 28. Doing this way can prevent the turbulent flow from occurring in the reducing gas introduced into the treatment chamber 2.

Figure 28:
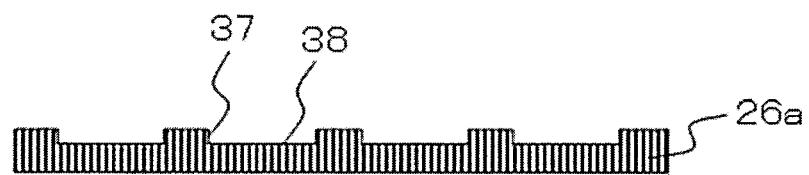
FIG. 28 is a sectional view showing the substrate holder according to Embodiment 8 of the present invention.
Figure 29:
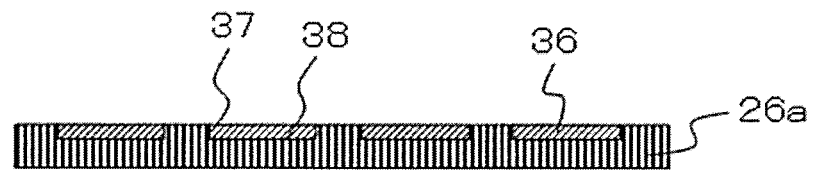
FIG. 29 is a sectional view showing the SiC bulk substrate being supported by the substrate holder according to Embodiment 8 of the present invention.
Figure 30:
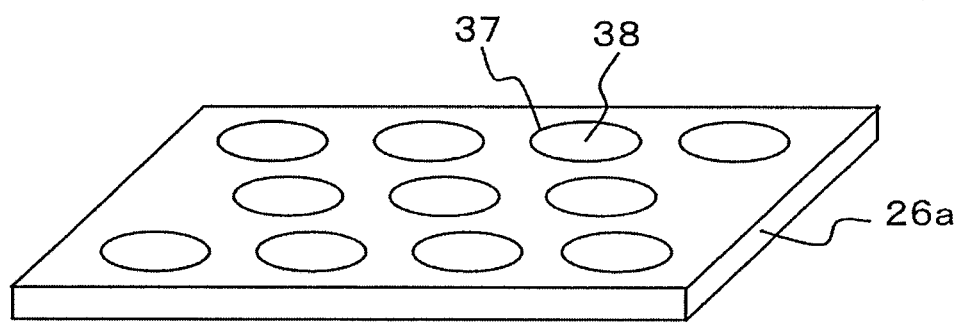
FIG. 30 is a perspective view showing the substrate holder according to Embodiment 8 of the present invention.

The substrate holder 26a will be described next. FIG. 28 is a sectional view showing the substrate holder 26a according to Embodiment 8 of the present invention. FIG. 29 is a sectional view showing the SiC bulk substrate 36 being supported by the substrate holder 26a according to Embodiment 8 thereof. FIG. 30 is a perspective view showing the substrate holder 26a according to Embodiment 8 thereof.

Preferably, the substrate holder 26a is relatively little influenced by the reducing gas, and is endurable to the heat treatment of around 1500 degrees C. or more. In addition, preferably it is formed with a substance that is maximally difficult to influence electro-conductivity of the SiC bulk substrate 36 that is to be processed, and preferably it minimally contains a substance, such as aluminum and nitrogen, that influences the electro-conductivity of the SiC bulk substrate 36. Further, in order to efficiently heat the SiC bulk substrate 36, preferably the action of the induction heating coil 17 causes an induced current to flow through the substrate holder 26a itself, and thereby the substrate holder 26a can be heated directly. Taking these into considerations, preferably the substrate holder 26a is formed of SiC, TaC or graphite (carbon), for instance. Preferably, the body portion of the substrate holder 26a is formed of highly purified graphite (carbon) and then the surface of the body portion is coated with a layer of SiC or TaC, to form the substrate holder 26a. Alternatively, the body portion may be formed of a material such as metal and the surface thereof may be coated with a layer of SiC, TaC or graphite (carbon), to form the substrate holder 26a.

As shown in FIG. 28, the substrate holder 26a has a plurality of recesses 37—areas for supporting the SiC bulk substrates 36. A single SiC bulk substrate 36 can be placed per single recess 37, so that it is designed that the plural SiC bulk substrates 36 can be placed therein by disposing the plural recesses 37.

As shown in FIG. 29, the recess 37 is formed so that the SiC bulk substrate 36 is fitted within the recess 37. In order to prevent occurrence of the turbulent flow in the reducing gas introduced into the treatment chamber 2, preferably the depth of the recess 37 is defined so that a structural stepped surface is minimally created between the SiC bulk substrate 36 placed within the recess 37 and the substrate holder 26a. Preferably, the difference between the thickness of the SiC bulk substrate 36 and the depth of the recess 37 is made to be ±500 μm or less, and more preferably, it is ±100 μm or less. Within the recess 37, the SiC bulk substrate 36 is placed with its epitaxial growth face facing upward, which results in the epitaxial growth face thereof being in contact with the reducing-gas flow path 16.

From a viewpoint of preventing the occurrence of the turbulent flow in the reducing gas, preferably the recess 37 has substantially the same shape as the outline of the SiC bulk substrate 36 and a minimum clearance is created between the recess 37 and the circumference of the SiC bulk substrate 36. However, taking into considerations the difference in thermal expansion coefficient between the SiC bulk substrate 36 and the substrate holder 26a, and work efficiencies of disposing the substrate 36 into the recess 37 and of taking out the substrate 36 from the recess 37, preferably there is a clearance on the order of 500 μm between the recess 37 and the circumference of the SiC bulk substrate 36.

The SiC bulk substrate 36 in many cases warps concentrically because of the difference in polishing conditions of its front and bottom surfaces. If the bottom surface 38 of the recess 37 is formed flat, the warp of the SiC bulk substrate 36 causes a clearance to be created between the bottom surface 38 of the recess 37 and the SiC bulk substrate 36. The size of the clearance caused by the warp of the SiC bulk substrate 36 increases as the diameter of the SiC bulk substrate 36 increases. To homogeneously heat the SiC bulk substrate 36, preferably the clearance between the SiC bulk substrate 36 and the bottom surface 38 of the recess 37 is as small as possible. Accordingly, the bottom surface 38 of the recess 37 is preferably shaped to be curved in conformity with the warp of the SiC bulk substrate 36. Specifically, the section of the bottom surface 38 thereof is preferably formed with a curve represented by a quadratic or higher function with respect to a distance from the center of the bottom surface 38 thereof.

As shown in FIG. 30, the recesses 37 of the substrate holder 26a are disposed in the form of face-centered two-dimensional lattice, so that the substrate holder 26a is designed to support the plural SiC bulk substrates 36 on a plane substantially in parallel with the direction in which the reducing gas flows. Further, the substrate holder 26a is disposed within the treatment chamber 2 so that one side of the face-centered two-dimensional lattice formed by the recess 37 is substantially in parallel with the direction in which the reducing gas flows. Consequently, the substrate holder 26a is designed to support the plural SiC bulk substrates 36 within the treatment chamber 2 so that the plural SiC bulk substrates 36 are disposed in the form of the face-centered two-dimensional lattice whose one side is substantially in parallel with the direction in which the reducing gas flows. For ease of illustration in FIG. 30, the recess 37 is shown to have a circular shape; however, actually, the SiC bulk substrates 36 each typically have a straight line portion such as orientation flat or index flat; therefore, preferably the recess 37 is shaped to also have a straight line portion, and is made to be substantially a similar figure to the outline of the SiC bulk substrates 36.

Next described will be a method of heat-treating the SiC bulk substrate 36 using the heat treatment apparatus 1a according to Embodiment 8 of the present invention and of fabricating an SiC bulk substrate for epitaxial growth, and operation of the heat treatment apparatus 1a.

Figure 31:
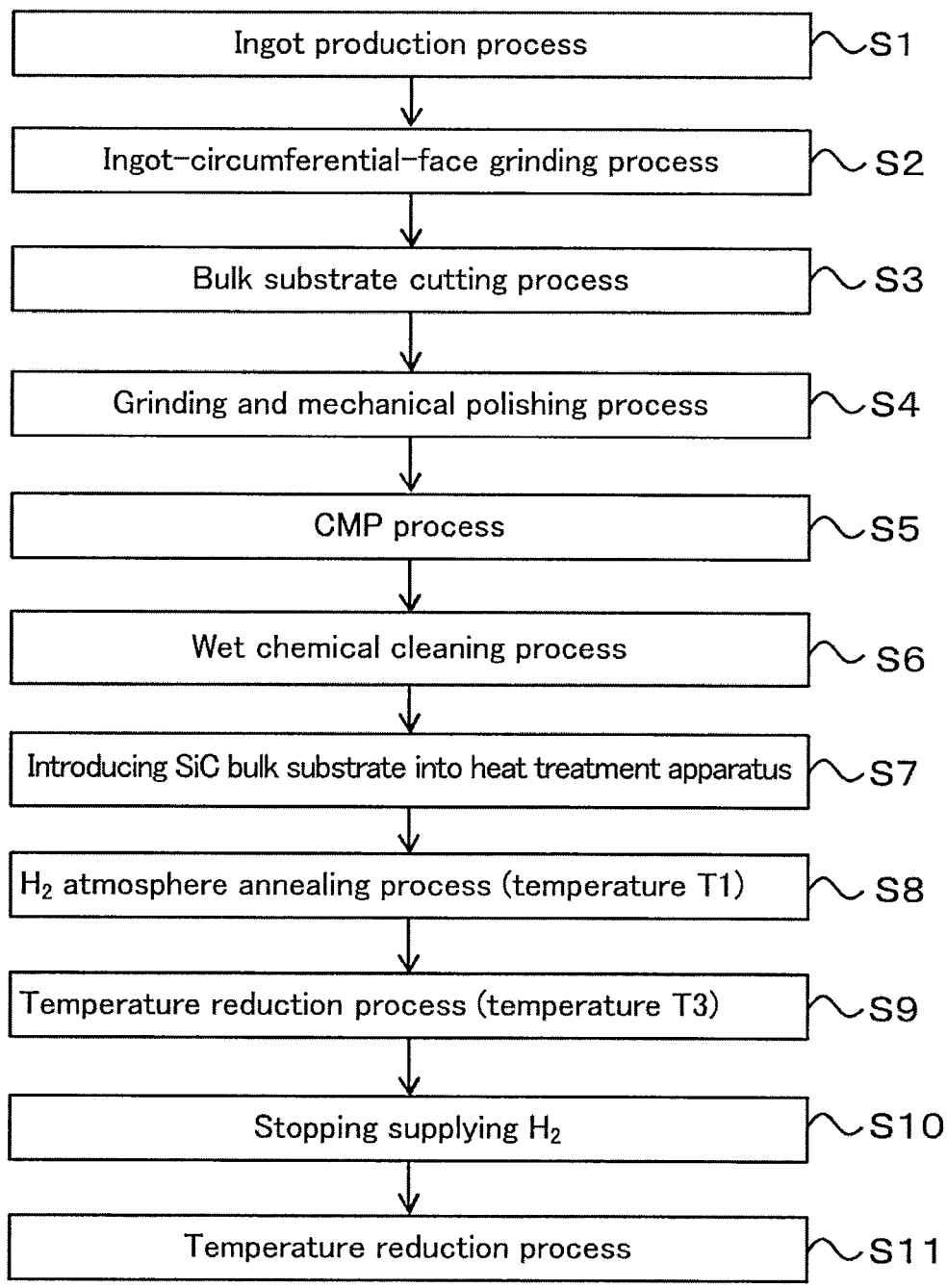
FIG. 31 is a flow diagram showing procedures of fabrication of an SiC bulk substrate for epitaxial growth according to Embodiment 8 of the present invention.

FIG. 31 is a flow diagram showing procedures of fabrication of an SiC bulk substrate for epitaxial growth according to Embodiment 8 of the present invention.

Processes of fabricating the SiC bulk substrate 36 will be described first. There exists a particular periodicity called polytype in a SiC crystal. In other words, even when the stoichiometric ratio of Si to C is 1:1 and the crystal lattice is of hexagonal close-packed structure, there exists a different type of periodicity for the atomic arrangement in parallel to c-axis in this structure. Physical properties of SiC are specified by a period in an atomic scale and symmetry of the crystal lattice. At present time, what attracts attention most from a view point of device application is a type called 4H—SiC. From a viewpoint of mainly reducing raw material costs, in power devices using 4H—SiC, mainly used is an epitaxial wafer that has a top surface tilted no more than around 5 degrees in a <11-20> direction from a <0001> face and employing a face where Si atoms can be more stably arranged than C atoms.

Accordingly, SiC bulk substrates of 4H—SiC type and having the specification of tilting by an angle smaller than about five degrees toward the <11-20> direction from the <0001> face, are fabricated for use here. However, the tilt direction is not strictly limited to the <11-20> direction, and may be specified as tilted to another direction. In addition, the polytype is limited to 4H, and may be another polytype such as 6H or 3C.

First, a seed crystal and a raw material are disposed oppositely within a crucible, and both are heated so that the raw material becomes higher in temperature, and through the sublimation method, a SiC monocrystal is grown on the seed crystal, to cast a SiC ingot made of 4H—SiC (S1). Next, the circumference of the SiC ingot is ground and the SiC ingot is thereby shaped into a cylindrical form (S2). At this time, an orientation flat process, etc. for defining a face orientation of the substrate is performed on the SiC ingot (S2). Next, by means of a method such as a wire saw or electrical discharge machining, the SiC ingot is cut into flat plates (S3). Next, the top surfaces and bottom surfaces of the SiC bulk substrates cut into flat plates are flattened by polishing and mechanical polishing (S4). Here, the circumference of the substrate is beveled in order to prevent cracking of the substrate.

A flaw, etc. resulting from grinding is present on the surface of the SiC bulk substrate fabricated by the above processes, and this flaw triggers a defect to be formed during epitaxial growth; thus, only the above processes are insufficient for providing good SiC bulk substrates for epitaxial growth.

Next, the SiC bulk substrate is flattened through machine polishing and chemical mechanical polishing (CMP) using a chemical solution that indicates acidity or alkalinity (S5). Then, the SiC bulk substrate after the CMP process is ultrasonically cleaned using a substance such as acetone, to remove organic substances adhering on the substrate surface. Further, sulfuric acid and hydrogen peroxide water are mixed at a volume ratio of 5:1, and the mixed solution is heated to approximately 130 degrees C. (±5 degrees C.). The SiC bulk substrate is immersed in the mixed solution, thereby removing mainly metal residue. Then, residual metal particles are removed by aqua regia solution.

Next, the SiC bulk substrate thus treated is cleaned through wet chemical cleaning called RCA cleaning (S6). Specifically, after immersed for 10 minutes in a mixed solution of ammonia water and hydrogen peroxide water (1:9), the SiC bulk substrate is immersed in another mixed solution of hydrochloric acid and hydrogen peroxide water (1:9) heated at 75 degrees C. (±5 degrees C.). Further, after immersed in a solution including hydrofluoric acid of a volume ratio of about 5%, the surface of the SiC bulk substrate is cleaned by replacing the solution with pure water. The above processes complete the SiC bulk substrate 36 on which the heat treatment using the heat treatment apparatus 1$a$ is to be performed.

Even by means of a series of wet chemical cleaning described above, the surface of the SiC bulk substrate 36 is not cleaned as well as in the case with another semiconductor material such as silicon. This is because, since atomic force in the SiC crystal is significantly strong as compared to that of the conventional semiconductor, a chemical solution that homogeneously dissolves the surface of the SiC bulk substrate 36 still remains to be found.

Figure 32:
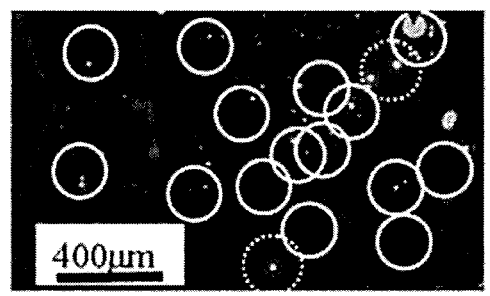
FIG. 32 is an optical microscope image of the surface of the SiC bulk substrate under dark field illumination, after a wet chemical cleaning process, according to Embodiment 8 of the present invention.

FIG. 32 is an optical microscope image of the surface of the SiC bulk substrate 36 under dark field illumination, after a wet chemical cleaning process, according to Embodiment 8 of the present invention. As will be described later, after the epitaxial growth, triangular defects were ascertained in areas circled with solid lines of FIG. 32, while carrot defects were observed in areas circled with dotted lines thereof. Comparatively intense light is seen in areas circled by dotted lines, and comparatively weak light is seen within areas circled by solid lines, or in the vicinities outside their respective areas. Here, intensely bright areas are those in which asperities on the bottom surface are reflected. Further, although the detailed observation shows smaller, punctiform bright portions in such areas, these areas will not affect later results. Such an observational method sensitively senses a state of the surface; thus, such observation shows that some microscopic particles adhere to the surface of the SiC bulk substrate 36.

Figure 33:
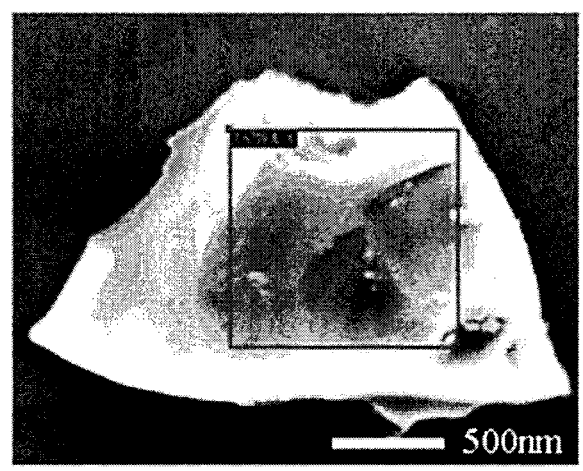
FIG. 33 shows a scanning electron microscope image of SiC dust present on the surface of the SiC bulk substrate after the wet chemical cleaning process, according to Embodiment 8 of the present invention.

FIG. 33 shows a scanning electron microscope image of the SiC dust present on the surface of the SiC bulk substrate 36 after the wet chemical cleaning process, according to Embodiment 8 of the present invention. As apparent from FIG. 33, it is discernable that foreign substances present in the above small bright areas indicate acute angled forms, and the foreign substance is sized at least at a micro-meter scale.

Figure 34:
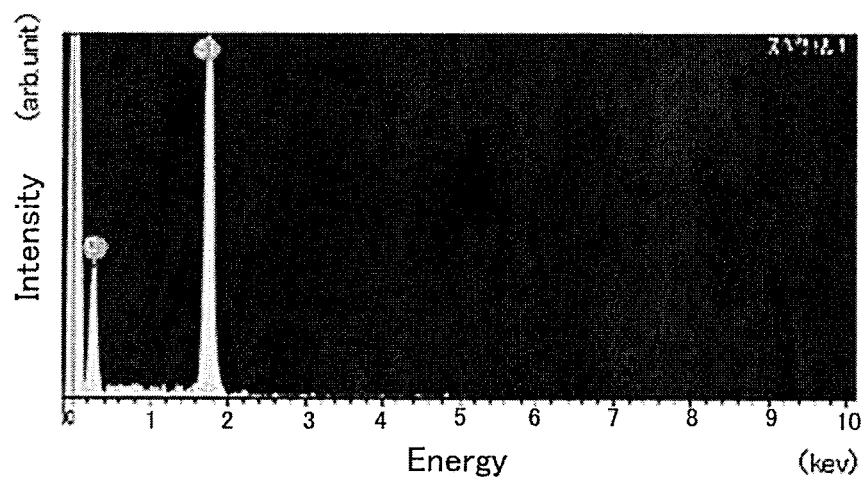
FIG. 34 is a spectrum showing a result obtained when an energy dispersive X-ray analysis is made on an area enclosed with a square in FIG. 33, according to Embodiment 8 of the present invention.

FIG. 34 is a spectrum showing a result obtained when an energy dispersive X-ray analysis is made on an area enclosed with a square in FIG. 33, according to Embodiment 8 of the present invention. Referring to FIG. 34, the vertical axis represents spectral intensity and the horizontal axis, energy. In FIG. 34, there are strong peaks from carbon and silicon, and those relative intensities showed that this residue is composed of SiC where the stoichiometric ratio is 1:1. In other words, it was found that although the above various types of cleaning are conducted, the SiC bulk substrate 36 still has the SiC dust adhered to its surface.

Figure 35:
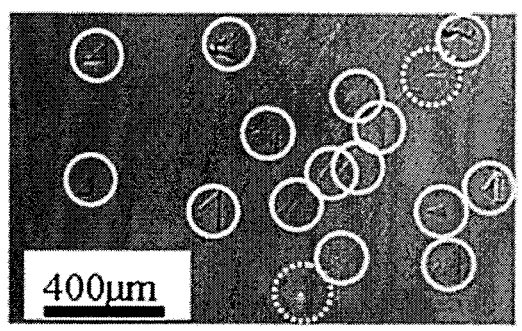
FIG. 35 is a Nomarski differential interference optical microscope image of the same area as in FIG. 32 under bright field illumination observed after epitaxial growth, according to Embodiment 8 of the present invention.

FIG. 35 is a Nomarski differential interference optical microscope image of the same area as in FIG. 32 under bright field illumination observed after epitaxial growth, according to Embodiment 8 of the present invention. Here, the epitaxial growth was carried out by setting a temperature of the SiC bulk substrate 36 at 1475 degrees C. Detailed temperatures for processes according to Embodiment 8 of the present invention will be described below. Such values to be shown as the treatment temperature strongly depend on a method of measurement. For that reason, the values measured with only the pyrometer are in principle used for measurement of temperature in the present invention. In this connection, when the temperature is measured with another measurement method, it will suffice if an offset value is calculated from a value measured at the same time with the pyrometer, and thereby the other measurement value is rectified.

The inventors of the present invention found out for the first time that there is formed a leakage current defect such as the carrot defect at the neighborhood of the area enclosed with the dotted lines and the triangular defect at the neighborhood of the area enclosed with the solid line in FIG. 32, as is apparent from FIG. 35.

In addition, if power devices have areas where such defects exist, it is generally known that a leakage current is generated at the time of application a high electric field. In other words, the presence of such defects represents a direct cause of significantly reducing the yield of semiconductor device. Therefore, unless such defects are eliminated, then the epitaxial growth layer that is well homogeneous and suitable for fabrication of power devices cannot be obtained at any possibility.

A process of removing the SiC dust by heat-treating the SiC bulk substrate 36 using the heat treatment apparatus 1$a$ according to Embodiment 8 of the present invention will be described below.

First, the take out door 31 of the heat treatment apparatus 1$a$ is opened and the substrate holder 26$a$, mechanically coupled to the stepped surface reduction member 27, is taken out to the outside of the treatment chamber 2. Next, each SiC bulk substrate 36 is disposed in the recess 37 of the substrate holder 26$a$ so that the epitaxial growth face is oriented upward. Subsequently, the substrate holder 26$a$ where the SiC bulk substrate 36 is disposed is introduced into the treatment chamber 2 together with the stepped surface reduction member 27 (S7). This results in the epitaxial growth face of the SiC bulk substrate 36 being in contact with the reducing-gas flow path 16. In order that unexpected particular or atomic impurities that remain within the treatment chamber 2 are prevented from influencing adversely, the treatment chamber 2 is evacuated using the exhaust pump 12 to a pressure of approximately $1 \times 10^{-7}$ kPa.

Figure 36:
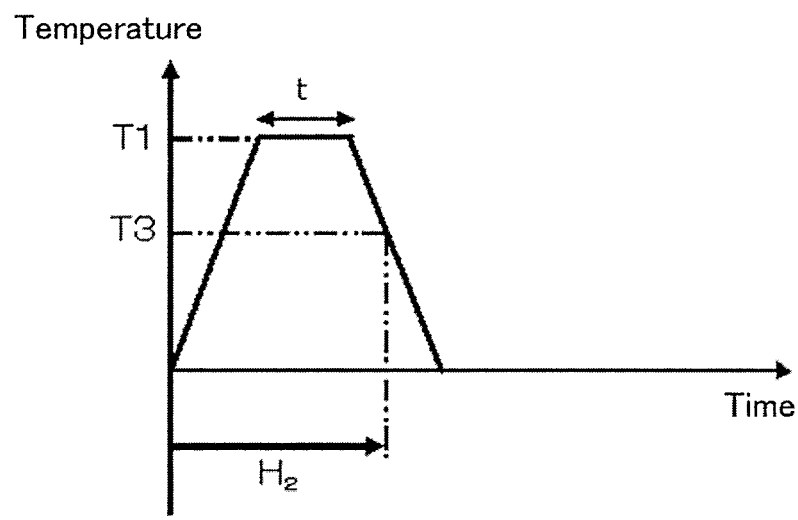
FIG. 36 is a graph showing a temperature profile and a gas sequence used for a procedure in which the SiC bulk substrate is heat-treated according to Embodiment 8 of the present invention.

FIG. 36 is a graph showing a temperature profile and a gas sequence used for a procedure in which the SiC bulk substrate 36 is heat-treated according to Embodiment 8 of the present invention. In FIG. 36, the vertical axis represents temperature, and the horizontal axis, time. The SiC bulk substrate 36 is next heat-treated according to the temperature profile and the gas sequence shown in FIG. 36.

For instance, hydrogen gas, serving as the reducing gas, is first introduced into the process chamber 2. However, the reducing gas is not limited to the hydrogen gas. The reducing gas supplied from the reducing-gas supply source 7, after impurity gas mixture is eliminated through the reducing-gas purification device 8, is introduced, via the valve 11 and the introduction nozzle 3, into the treatment chamber 2. The reducing gas introduced into the treatment chamber 2 is exhausted through the reducing-gas flow path 16 from the exhaust nozzle 6 to the outside of the treatment chamber 2. The reducing gas exhausted is abated using the reducing gas abatement device 13.

Under a setup where the reducing gas is introduced thereinto and is in contact with the epitaxial growth face of the SiC bulk substrate 36, the pressure within the treatment chamber 2 is adjusted so that the degree of vacuum therewithin is maintained constant at, e.g., about 25 kPa. In Embodiment 8 of the present invention, an example under the above pressure will be described in detail. Generally, suitable pressure is variable for each heat treatment apparatus, depending on the differences in construction and structural shape of the treatment chamber 2. Taking such differences into accounts, it is suitable to set the pressure to a decompression atmosphere at a value within 1 kPa to 70 kPa. This is because if the pressure is below 1 kPa, substitution reaction efficiency of the reducing gas is reduced, and if higher than 70 kPa, etching of the SiC bulk substrate 36 becomes dominant, which thereafter degrades the surface flatness of the epitaxial growth layer obtained by the epitaxial growth on the SiC bulk substrate 36.

Then, the induction heating coil 18 is energized thereby heating the lower susceptor 22 and the substrate holder 26a, to heat the SiC bulk substrate 36 up to a predetermined treatment temperature T1. Preferably, the temperature T1 is set at a temperature of e.g., 1550 degrees C. or more. In the atmosphere of reducing gas, the temperature of the SiC bulk substrate 36 is maintained at the temperature T1 during a treatment time t (S8). The treatment time t denotes, for instance, 10 to 180 seconds and preferably, it is set at a suitable time, according to the temperature T1. At this time, the upper induction heating coil 17 is also energized to heat the upper susceptor 21, whereby the reducing gas that flows through the flow path 16 is heated and then heating efficiency of the SiC bulk substrate 36 increases.

Next, in the atmosphere of reducing gas, the same pressure is maintained while the temperature of the SiC bulk substrate 36 is lowered. Here, from a viewpoint of reducing the amount of use of the reducing gas, it is advantageous that the supply of the reducing gas is shut off before the temperature of the SiC bulk substrate 36 reaches the chamber temperature. Therefore, when the temperature of the SiC bulk substrate 36 is reduced to a predetermined temperature T3 that is lower than the temperature T1 (S9), the supply of the reducing gas is shut off (S10), and thereafter the temperature thereof is reduced to a temperature lower than the temperature T3 (S11). By the above processes the heat treatment is finished, thereby completing the SiC bulk substrate for epitaxial growth.

When the substrate is not heat-treated this way and if the epitaxial growth is carried out, it is known that the leakage current defect occurs with a high density of at least 10 pieces/$cm^2$.

As described above, the main cause of the carrot defect and the triangular defect is SiC dust that adheres to the SiC bulk substrate 36; thus, in order to selectively remove the SiC dust in such a way that the SiC bulk substrate 36 itself is not damaged, it is vey effective to heat-treat under atmosphere of the reducing gas the SiC dust that is chemically adsorbed on the SiC bulk substrate 36.

In other words, the SiC dust is presumed to adhere to the surface of the SiC bulk substrate 36 in the hydrofluoric acid finally used in the above chemical solution process. Hydrofluoric acid treatment is employed basically for removing an oxide film on the SiC surface. Thus, in the hydrofluoric acid, oxide film is not formed on both of the SiC bulk substrate 36 and the SiC dust adhered. When the SiC bulk substrate 36 is exposed to atmospheric air, both surfaces immediately start being oxidized. Judging from the shape of the SiC dust, because the surface of the SiC dust is not flat at atomic level, the SiC dust and the SiC bulk substrate 36 presumably adhere together via the thin oxide film. Therefore, in order to selectively remove the SiC dust from the substrate surface without damaging the SiC bulk substrate 36, it is very effective to conduct a process in which, after removal of both oxide films by heat treatment in the reducing gas, surface atoms on both are replaced by, for instance, hydrogen atoms contained in the reducing gas, and thereby their surfaces are stabilized. It is because, through such treatment, the surfaces of both are hydrogen-terminated to each other, electrochemical repulsion between both is produced, and in addition, by the flow of the reducing-gas, itself, the SiC dust could be carried downstream—in the direction of flow of the reducing gas—from the surface of the SiC bulk substrate 36. As a result, the SiC dust that has adhered to the surface of the SiC bulk substrate 36 is removed without causing any damage to the SiC bulk substrate 36.

However, when the temperature T3 at which the supply of the reducing gas is shut off is a too high temperature, surface atoms of the SiC bulk substrate 36 are terminated with substances other than, for instance, hydrogen atoms contained in the reducing gas, or an oxide layer is formed resulting from the formation of surface dangling bond. Considering avoidance of such occurrence, the temperature T3 of the SiC bulk substrate 36, when the supply of the reducing gas is shut off, is preferably 900 degrees C. or less, and more preferably 300 degrees C. or less. The reason that the temperature is preferably 300 degrees C. or less is not only that the surface atoms of the SiC bulk substrate 36 is completely terminated with, for instance, hydrogen atoms contained in the reducing gas, but also that because of efficient fabrication of substrates, the rate of decline of the substrate temperature can be increased and an efficient temperature reduction can be achieved for a short period of time.

Time required for the temperature reduction process is preferably short. When the time required for the temperature reduction process is long, the SiC dust and the like adhering or remaining in the treatment chamber 2 adhere anew to the surface of the SiC bulk substrate for epitaxial growth, cleaned through the above heat treatment process, and becomes anomalous growth nucleus during the epitaxial growth, to in some cases form a leakage current defect.

In Embodiment 8 of the present invention, the apparatus is configured as described above, so that the advantageous effect is that even if an epitaxial growth is carried out without a particular pre-treatment process to lower the productivity such as in a treatment requiring long time, the heat treatment apparatus 1a is provided that allows easy fabrication of SiC bulk substrates for epitaxial growth from which SiC epitaxial wafers are obtained which are low in density of defect—a cause of leakage current in SiC devices—after the epitaxial growth.

In particular, by disposing the stepped surface reduction member 27 adjacently to the substrate holder 26a, the surface of the substrate holder 26*a* in contact with the reducing-gas flow path 16 and the surface of the stepped surface reduction member 27 in contact with the reducing-gas flow path 16 can be made to be present on substantially the same plane. In other words, the structural stepped surface in the reducing-gas flow path for 16 can be reduced, thereby preventing a turbulent flow from occurring in the flow of the reducing gas introduced into the treatment chamber 2. The occurrence of turbulent flow in some cases causes the SiC dust—once separated from the surface of the SiC bulk substrate 36—not to flow downstream, but to re-adhere to the substrate 36. Because by the prevention of occurrence of the turbulent flow, re-adhesion of the SiC dust thereto can be prevented, a SiC epitaxial wafer of low defect density after epitaxial growth can be provided.

In addition, disposing the stepped surface reduction member 28 adjacently to the upper susceptor 21 allows the surface of the upper susceptor 21 in contact with the reducing-gas flow path 16 to be present on substantially the same plane as the surface of the reduction member 28 in contact with the reducing-gas flow path 16. In other words, the structural stepped surface in the reducing-gas flow path 16 can be reduced, so that the turbulent flow in the reducing gas introduced into the treatment chamber 2 can be prevented from occurring. SiC epitaxial wafers having lower defect density after the epitaxial growth can thereby be provided.

By disposing the plural recesses 37 in the form of face-centered quadratic lattice on the substrate holder 26*a*, the plural SiC bulk substrates 36 are supported by the substrate holder 26*a* so as to be arranged in the form of face-centered quadratic lattice on a plane that is substantially in parallel with the direction in which the reducing gas flows, thereby allowing the SiC bulk substrates 36 to be disposed more densely on the substrate holder 26*a*. This enables the plural SiC bulk substrates 36 to be more homogeneously heated on the substrate holder 26*a*.

Further, on the substrate holder 26*a*, the SiC bulk substrates 36 are disposed in the form of face-centered quadratic lattice whose one side is substantially in parallel with the direction in which the reducing gas flows, so that the SiC bulk substrates 36 can be disposed more densely on the substrate holder 26*a* without reducing the distance between the SiC bulk substrates 36 that are located adjacent to each other substantially in parallel with the direction in which the reducing gas flows. When the distance is short between the SiC bulk substrates 36 located adjacent to each other substantially in parallel with the direction in which the reducing gas flows, SiC dust separated from the surface of the SiC bulk substrate 36 is in some cases carried by the flow of the reducing gas, and re-adheres to another SiC bulk substrate 36 located adjacent thereto substantially in parallel with the direction in which the reducing gas flows. However, the apparatus according to Embodiment 8 of the present invention is implemented as described above, so that the SiC dust separated from the surface of the SiC bulk substrate 36 can be prevented from re-adhering on another SiC bulk substrate 36 located adjacent thereto substantially in parallel with the direction in which the reducing gas flows.

Further, the substrate holder 26*a* is formed of SiC, TaC or graphite (carbon), or formed to have a layer of SiC, TaC or graphite (carbon) on its surface, thereby avoiding any adverse influence on electro-conductivity of the SiC bulk substrate 36 to be processed.

This holds for the stepped surface reduction members 27 and 28. They are formed of SiC, TaC, or graphite (carbon), or formed to have a layer of SiC, TaC or graphite (carbon) on its surface, thereby avoiding any adverse influence on electro-conductivity of the SiC bulk substrate 36 to be processed.

In Embodiment 8 of the present invention, the stepped surface reduction members 27 and 28 are disposed upstream and downstream of the substrate holder 26*a* with respect to the direction in which the reducing gas flows. However, the situation where a turbulent flow occurs upstream of the substrate holder 26*a* has more influence on the re-adhesion of the SiC dust once separated from the surface of the SiC bulk substrate 36 than the situation where it does downstream thereof. For this reason, even when the stepped surface reduction members 27 and 28 are disposed only upstream of the substrate holder 26*a*, a certain advantageous effect is achieved. Further, even when only the stepped surface reduction member 27 adjacent to the substrate holder 26*a* is disposed without disposing the stepped surface reduction members 28 adjacent to the upper susceptor 21, a certain advantageous effect is achieved.

As shown in FIG. 25, the stepped surface reduction member 27 is disposed in contact with the inner wall of the treatment chamber 2, but does not necessarily need to be in contact with the inner wall of the treatment chamber 2. It will suffice if the reduction member is disposed so that the surface of the substrate 26*a* in contact with the reducing-gas flow path 16 and the surface of the reduction member 27 in contact with the reducing-gas flow path 16 are present on substantially the same plane. This holds for the stepped surface reduction member 28. It will suffice if the reduction member is disposed so that the surface of the upper susceptor 21 in contact with the reducing gas flow path 16 and the surface of the stepped surface reduction member 28 in contact with the reducing gas flow path 16 are present on substantially the same plane. Therefore, the thickness, shape and the like of the stepped surface reduction members 27 and 28 can be defined as required. The members do not need to be of plate type.

Further, in Embodiment 8 of the present invention, the induction heating coils 17 and 18 are disposed on the outer surfaces of the treatment chamber 2, but not limited thereto, and may be disposed within the treatment chamber 2. Further, the induction heating coils 17 and 18 are used as heating devices, but the invention is not limited thereto. Since induction heating devices can extensively heat homogeneously, preferably the induction heating devices are used for heat treatment of many SiC bulk substrates 36.

In Embodiment 8 of the present invention, the introduction nozzle 3 is connected to the side of the treatment chamber 2, but the connection point is not limited thereto, and may be another point such as an upper or lower portion thereof. Likewise, the connection point of the exhaust nozzle 6 is not limited to the upper potion.

Further, the number of the introduction nozzles 3 is not limited to one and plural nozzles may be used. For instance, densely disposing many minute nozzles can prevents turbulent flow from occurring in the reducing gas. Likewise, for the exhaust nozzle 6, plural nozzles may be used.

Further, in Embodiment 8 of the present invention, the stepped surface reduction members 27 and 28 are disposed within the treatment chamber 2, thereby reducing the structural stepped surface in the reducing-gas flow path 16. However, the stepped surface reduction members 27 and 28 may be formed as a part of the inner wall of the treatment chamber 2 so as to be integral with the inner wall thereof. In other words, the reduction members may be formed so that the inner wall of the treatment chamber 2, the surface of the substrate holder 26*a* in contact with the reducing-gas flow path 16, and the surface of the upper susceptor 21 in contact therewith, are present on substantially the same plane.

Embodiment 9

Figure 37:
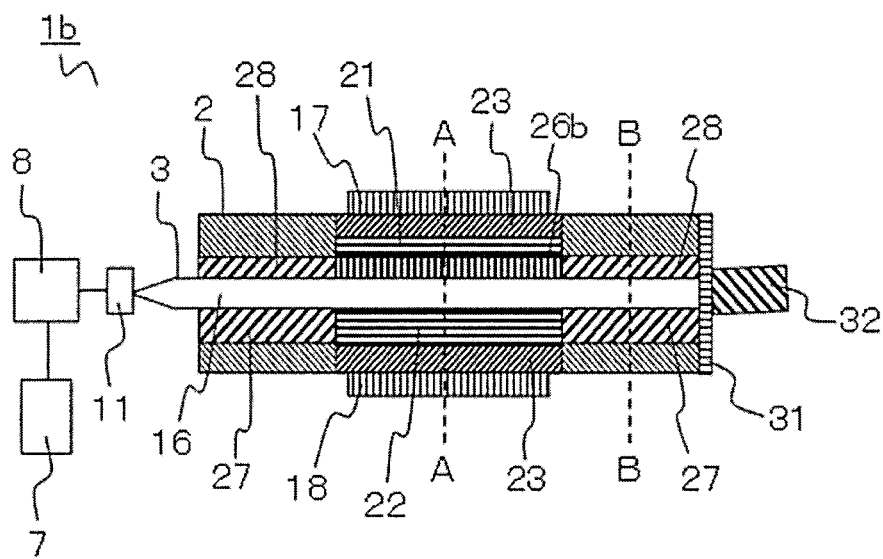
FIG. 37 is a sectional side view showing a heat treatment apparatus according to Embodiment 9 of the present invention.

FIG. 37 is a sectional side view showing the heat treatment apparatus 1*b* according to Embodiment 9 of the present invention. Referring to FIG. 37, components with the same reference numerals as in FIG. 25 show the same or corresponding ones, and their descriptions are not provided herein. The difference from Embodiment 8 of the present invention is that the apparatus is configured such that in place of disposing the substrate holder 26a on the lower susceptor 22, the substrate holder 26b is disposed underneath the lower susceptor 21.

Accordingly, a surface of the substrate holder 26b in contact with the reducing-gas flow path 16 and a surface of the stepped surface reduction member 28 in contact therewith, are designed to be present on substantially the same plane. Then, a surface of the lower susceptor 22 in contact with the reducing-gas flow path 16 and a surface of the stepped surface reduction member 27 in contact therewith, are present on substantially the same plane.

Figure 38:
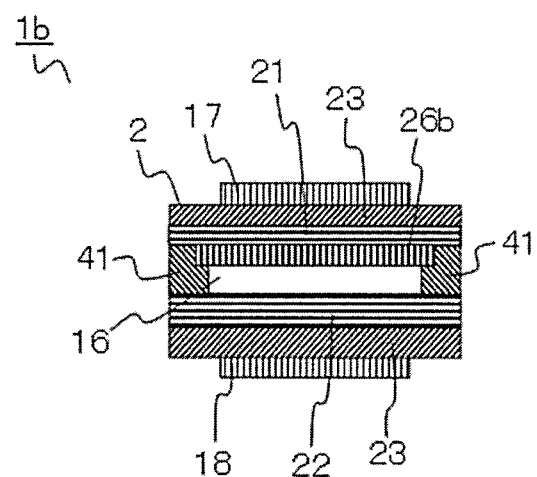
FIG. 38 is a sectional view taken along line A-A of FIG. 37 according to Embodiment 9 of the present invention.

FIG. 38 is a sectional view taken along line A-A of FIG. 37 according to Embodiment 9 of the present invention. As shown therein, the substrate holder 26b is supported by side susceptors 41 and disposed so that its lower surface is in contact with the reducing-gas flow path 16. The upper susceptor 21 and the substrate holder 26b are in contact with each other. Referring to FIG. 38, the reducing gas introduced into the treatment chamber 2 flows through the flow path 16 in the direction perpendicular to the plane of the figure.

Figure 39:
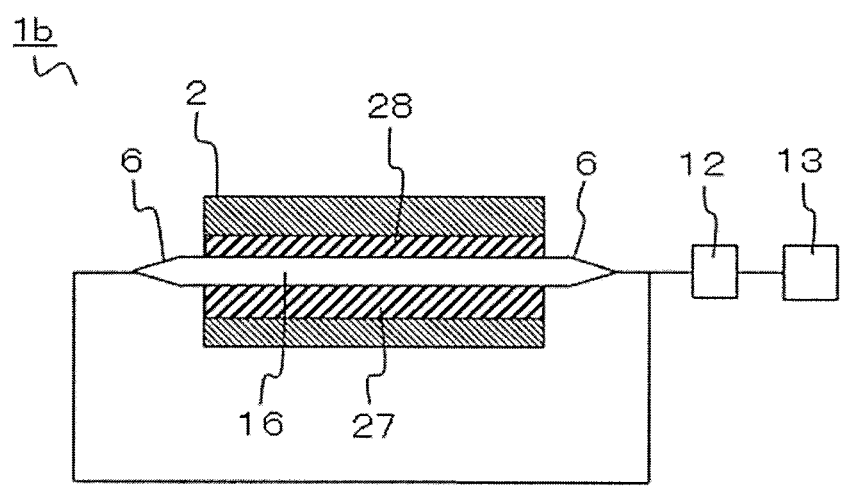
FIG. 39 is a sectional view taken along line B-B of FIG. 37 according to Embodiment 9 of the present invention.

FIG. 39 is a sectional view taken along line B-B of FIG. 37 according to Embodiment 9 of the present invention. Difference of Embodiment 9 of the present invention from Embodiment 8 thereof is that the apparatus is configured such that the exhaust nozzle 6 is connected not to the upper surface of the treatment chamber 2, but to two opposing sides thereof. The reducing gas, introduced from the introduction nozzle 3 to the inside of the treatment chamber 2, flows through the flow path 16 transversely in FIG. 37, i.e., in the direction perpendicular to the plane of FIG. 38, and is exhausted from the exhaust nozzle 6 to the outside of the treatment chamber 2. The reducing gas, exhausted from the exhaust nozzle 6, enters through the exhaust pump 12 into the reducing-gas abatement device 13, where the gas is abated.

Figure 40:
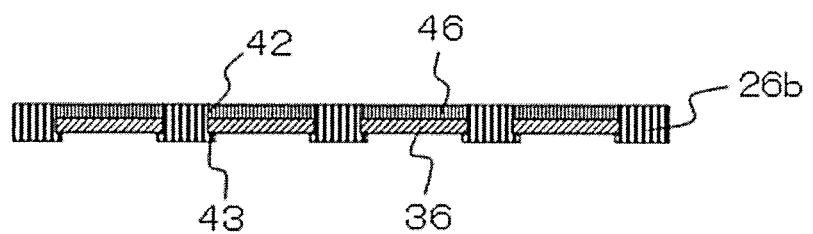
FIG. 40 is a sectional view showing the SiC bulk substrate being supported by the substrate holder according to Embodiment 9 of the present invention.
Figure 41:
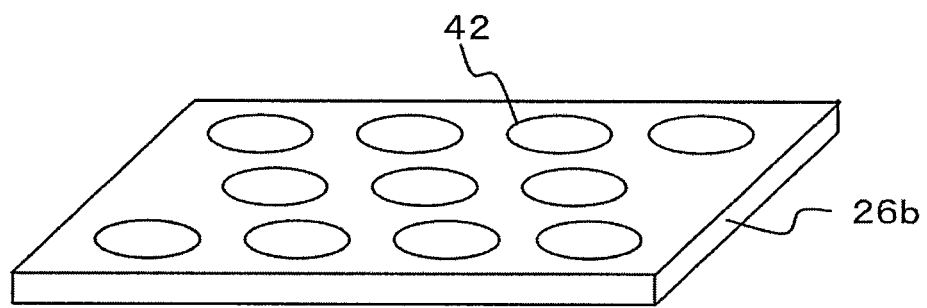
FIG. 41 is a perspective view showing the substrate holder according to Embodiment 9 of the present invention.

The substrate holder 26a will be described next. FIG. 40 is a sectional view showing the SiC bulk substrate 36 being supported by the substrate holder 26b according to Embodiment 9 of the present invention. FIG. 41 is a perspective view showing the substrate holder 26b according to Embodiment 9 of the present invention.

As shown in FIG. 40, the substrate holder 26b has through-holes 42; and supporting portions 43 for supporting the SiC bulk substrate 36, on the side where the through-holes 42 are in contact with the reducing-gas flow path 16, i.e., on the bottom side of the holder in FIG. 40. Each of the through-holes 42 is a similar figure to the outline of the SiC bulk substrate 36, and is formed to be greater in diameter than the SiC bulk substrate 36. Specifically, preferably the through-hole 42 is sized such that a clearance of on the order of 500 μm is created between the through-hole 42 and the circumference of the SiC bulk substrate 36. Each of the supporting portions 43 is a similar figure to the SiC substrate 36, and is formed to be smaller in diameter than the SiC bulk substrate 36.

As the SiC bulk substrate 36 is placed from the top side in FIG. 40 into each through-hole 42, each supporting portion 43 supports the SiC bulk substrate 36. Within the through-holes 42, the SiC bulk substrate 36 is disposed so that the epitaxial growth face is oriented downward, and as a result, the epitaxial growth face of the SiC bulk substrate 36, thus disposed, is in contact with the reducing-gas flow path 16.

Further, in order to increase the heating efficiency, a soaking plate 46 is disposed on the SiC bulk substrate 36 so that a clearance between the SiC bulk substrates 36 and the upper susceptor 21 is filled. Preferably, the soaking plate 46 is formed of the same material as of the substrate holder 26b. In many cases the SiC bulk substrate 36 warps concentrically because of the difference between polishing conditions of its top and bottom surfaces; therefore, in order to increase the heating efficiency, preferably the soaking plate 46 is shaped to curve according to warping of the SiC bulk substrate 36.

As shown in FIG. 41, the through-holes 42 of the substrate holder 26a are disposed in the form of face-centered quadratic lattice, so that the substrate holder 26a is designed to support the plural SiC bulk substrates 36 on a plane substantially in parallel with the direction in which the reducing gas flows. For ease of illustration in FIG. 41, each through-holes 42 is shown to have a circular shape; however, actually, the SiC bulk substrate 36 typically has a straight line portion such as orientation flat; therefore, preferably the through-hole 42 is shaped to also have a straight line portion, and is made to be substantially a similar figure to the outline of the SiC bulk substrate 36.

In Embodiment 9 of the present invention, as described above, the substrate holder 26b supports the SiC bulk substrate 36 so that the epitaxial growth face of the SiC bulk substrate 36 is oriented downward, and in contact with the reducing-gas flow path 16, whereby from the effect of the heat treatment in the atmosphere of reducing gas, SiC dust, separated from the surface of the SiC bulk substrate 36, falls downward because of the pull of gravity. This can prevent the SiC dust, once separated from the surface of the SiC substrate 36, from re-adhering to the surface thereof. Therefore, SiC epitaxial wafers having lower defect density after epitaxial growth can be provided.

In Embodiment 9 of the present invention, what differs from Embodiment 8 has been described, and what is the same component as in, or a corresponding component to, Embodiment 8, has not been described.

Embodiment 10

Figure 42:
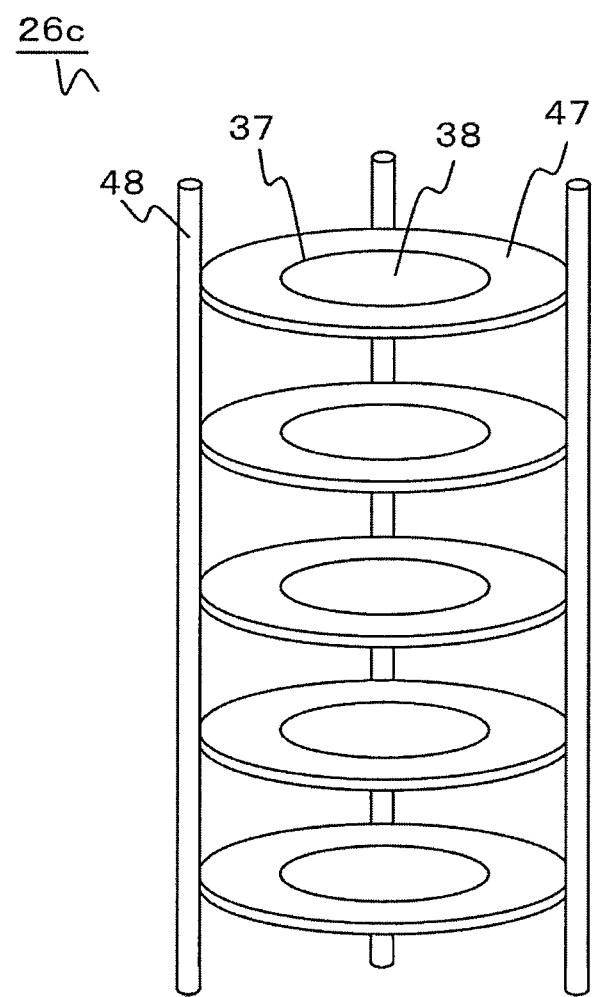
FIG. 42 is a perspective view showing a substrate holder according to Embodiment 10 of the present invention.

FIG. 42 is a perspective view showing a substrate holder 26c serving as the substrate supporter according to Embodiment 10 of the present invention. Referring to FIG. 42, components with the same reference numerals as in FIG. 30 show the same or corresponding ones, and their descriptions are not provided herein. The difference in configuration is that, in Embodiment 8 of the present invention, the substrate holder 26a supports the plural SiC bulk substrates 36 so that, on a plane substantially in parallel with the direction in which the reducing gas flows, the SiC bulk substrates 36 are in the form of face-centered quadratic lattice, whereas in Embodiment 10 of the present invention, the substrate holder 26c supports each of the SiC bulk substrates 36 on a plurality of planes substantially in parallel with each other.

As shown in FIG. 42, the substrate holder 26c has a plurality of substrate trays 47, and the plural substrate trays 47 are supported substantially in parallel with each other by tray support rods 48. Then, in the neighborhood of the center of each of the substrate trays 47, as with the substrate holder 26a, the recess 37 is formed which is an area for supporting the SiC bulk substrate 36. In this case, each one of the recesses 37 is formed per substrate tray 47, and each substrate tray 47 is designed to support a single SiC bulk substrate 36. Because as described above, the substrate trays 47 are disposed substantially in parallel with each other, the SiC bulk substrates 36 supported by the respective substrate trays 47 are also in parallel with each other. It will suffice if a distance between the substrate trays 47 is made to be on the order of, for instance, one mm from a viewpoint of workability and compactness in size of the apparatus.

The recess 37 is the same as in the substrate holder 26a according to Embodiment 8 of the present invention, and preferably, its depth is defined so that a minimum structural stepped surface is created between the SiC bulk substrate 36 placed within the recess 37 and the substrate tray 47. Within the recess 37, the SiC substrate 36 is placed so that the epitaxial growth face is oriented upward, and as a result, the epitaxial growth face of the SiC bulk substrate 36 is in contact with the reducing-gas flow path.

For ease of illustration in FIG. 42, the recess 37 is shown to have a circular shape; however, actually, the SiC bulk substrate 36 typically has a straight line portion such as orientation flat or index flat; therefore, preferably the recess 37 is shaped to also have a straight line portion, and is made to be substantially a similar figure to the outline of the SiC bulk substrate 36. In FIG. 42, the shape of the substrate tray 47 is shown to be circular, but not limited thereto.

The material of the substrate holder 26c is the same as that of the substrate holder 26a according to Embodiment 8 of the present invention. For instance, preferably, the body portions of the substrate trays 47, and the tray support rods 48, of the substrate holder 26c are formed of highly pure graphite (carbon) and the surfaces of the body portions are coated with layers of SiC or TaC, to form the substrate holder 26c.

In Embodiment 10 of the present invention, the SiC substrate 36 is placed on the substrate holder 26c described above and heat treated with it fixedly placed within the treatment chamber 2 of the heat treatment apparatus. Here, preferably the heat treatment apparatus is shaped to be cylindrical form that encloses the substrate holder 26c. It will suffice if the reducing gas flows such that the sufficient amount of the gas is supplied to the surface of the SiC bulk substrate 36 placed on the substrate tray 47. For instance, placing the introduction nozzle 2 in the upper left portion of FIG. 42 and the exhaust nozzle 6 in the lower right portion thereof, allows the reducing gas to flow in laminar flow along the surface of each SiC bulk substrate 36.

Meanwhile, since the tray support rods 48 block the flows of the reducing gas in the neighborhoods of the rods 48, the turbulent flows are easier to occur than in any other areas, and the volume of an area where the turbulent flow is easy to occur varies every second during heat treatment because of influences such as of heat fluctuation and fluctuation of flow volume of the reducing gas. As the SiC dust, removed through heat treatment from the surface of the SiC bulk substrate 36, is caught into the turbulent flow created in the neighborhood of the tray support rod 48, there is a possibility of dust remaining within the area of the turbulent flow for a long time, and re-adhering to the surface of the SiC bulk substrate 36 after completion of heat treatment.

However, areas where the turbulent flows are created are limited to the neighborhoods of the tray support rods 48; therefore, if the SiC bulk substrate 36 is disposed at a location sufficiently away from each of the tray support rods 48, it makes it less likely for the above SiC dust to re-adhere thereto. A turbulent flow is almost never created in an area spaced e.g., approximately 5 mm inwardly away from the tray support rod 48, i.e., from the circumference of the substrate tray 47; therefore, in order to prevent the SiC dust—once removed from the surface of the SiC bulk substrate 36—from re-adhering to the surface thereof because of the influences of the turbulent flows created in the neighborhoods of the tray support rods 48, it will suffice if a distance between the circumference of the substrate tray 47 and that of the SiC bulk substrate 36 is made to be greater than 5 mm.

On the other hand, if the distance between the circumference of the substrate tray 47 and that of the SiC bulk substrate 36 is made to be too large, i.e., if the size of the substrate tray 47 is made to be too large relative to that of the SiC bulk substrate 36, then the volume needing to be heated during heat treatment increases, thereby reducing the heating efficiency. From a viewpoint of the heating efficiency, preferably the distance between the circumferences of the substrate tray 47 and the SiC bulk substrate 36 is made to be less than 100 mm.

In addition, in order to further prevent creation of the turbulent flows in the neighborhoods of the tray support rods 48, it will suffice if during heat treatment the amount of flow of the reducing gas is varied and the so-called Reynolds numbers serving as an indicator of creation of a turbulent flow is effectively changed. An effective way of varying the amount of flow of the reducing gas is to irregularly change the flow amount, for instance.

In Embodiment 10 of the present invention, as described above, each of the SiC bulk substrates 36 is supported on the respective substrate trays 47 substantially in parallel, i.e., on planes substantially in parallel, and thereby the SiC bulk substrates 36 are disposed in a multi-layer stack configuration; therefore, the heat treatment apparatus can be reduced in size as compared with the plural SiC bulk substrates 36 being disposed on the same plane.

The distance between the circumference of the substrate tray 47 and that of the SiC bulk substrate 36 is made to be greater than 5 mm and smaller than 100 mm, so that the SiC dust, once desorbed from the SiC bulk substrate 36, is made less likely to re-adhere to the surface of the substrate 36 because of the influence of the turbulent flows. Further, the reduction of the heating efficiency during heat treatment can also be prevented.

In Embodiment 10 of the present invention, a single SiC bulk substrate 36 is placed per substrate tray 47; however, the plural SiC bulk substrates 36 may be placed per substrate tray 47.

Further, in Embodiment 10 of the present invention, the substrate tray 47, and the tray support rod 48, of the substrate holder 26c are formed by different materials; however, the substrate holder 26c may be formed as a single member in which the substrate tray 47 and the tray support rod 48 are combined together. In addition, even when the holder 26c is formed using the different members, the shape of the tray support rod 48 is not limited to the rod-shape.

In Embodiment 10 of the present invention, the plural substrate trays 47 are disposed perpendicularly in a multi-layer configuration, i.e., the plural substrate trays 47 are lined up perpendicularly; however, they do not necessarily need to be lined up perpendicularly. For instance, the substrate holder 26c, as shown in FIG. 42, may be disposed with it rotated 90 degrees, to cause the surfaces of the SiC bulk substrates 36 to be each placed substantially in parallel with the perpendicular direction. With this arrangement, when the number of the substrate trays 47 to place the SiC bulk substrate 36 thereon is large, e.g., 10 or more, the substrate holder 26c and the heat treatment apparatus are made long in size; however, when compared with situations where the trays are lined up perpendicularly, the holder 26c and the apparatus are mechanically stable. Therefore, the influence of vibrations and the like on the heat treatment apparatus can be reduced. In this case, preferably the SiC bulk substrates 36, each placed on the respective substrate trays 47, are fixedly placed so as not to fall therefrom.

Further, the shape of the substrate holder 26c is not limited to that shown in FIG. 42. For instance, the holder may be configured such that a semi-cylindrical recess is machined in a cuboid, and the SiC bulk substrate 36 is inserted into the semi-cylindrical portion and supported thereat.

As described above, Embodiment 1 through Embodiment 10 have been disclosed and their details have been described. The descriptions illustrate applicable aspects of the present invention, and the present invention is not limited thereto. Namely, various revisions and modifications may be made to the described aspects without departing from the scope of the present invention.

REFERENCE NUMERALS 1a, 1b heat treatment apparatus
2 treatment chamber
3 introduction nozzle
6 exhaust nozzle
16 reducing-gas flow path
17 induction heating coil
18 induction heating coil
26a-26c substrate holder
27 stepped surface reduction member
28 stepped surface reduction member
36 SiC bulk substrate
47 substrate tray
48 tray support rod

The invention claimed is:

1. A method of manufacturing a silicon carbide epitaxial wafer, the method comprising:
  I) annealing a silicon carbide bulk substrate that is tilted less than 5 degrees from <0001> face, in an atmosphere comprising hydrogen at a first temperature T1 for a treatment time t;
  II) reducing the temperature of the substrate in the hydrogen atmosphere; and then
  III) performing epitaxial growth at a second temperature T2 below the annealing temperature T1 in I), while supplying a gas mixture comprising a first gas comprising a silicon atom and a second gas comprising a carbon atom.

2. The method of claim 1, wherein the first temperature T1 is higher than the second temperature T2 by 75 degrees C. or more.

3. The method of claim 1, wherein the epitaxial growth is performed by a CVD method.

4. The method of claim 1, wherein the first gas is a monosilane gas, and the second gas is propane.

5. The method of claim 1, wherein the silicon carbide bulk substrate is composed of 4H—SiC.

6. The method of claim 1, wherein the treatment time t in I) ranges from 10 seconds to 180 seconds.

7. The method of claim 1 wherein providing that the lowest temperature at which annealing effect occurs in I) is defined as an offset temperature To, and a value of (T1−To)×t ranges from 0 to 21000.

8. The method of claim 7, wherein the value of (T1−To)×t ranges from 500 to 13500.

9. The method of claim 1, wherein an epitaxial growth layer formed in III) has an n-type residual impurity density of $2 \times 10^{16}$ cm$^{-3}$ or less.

10. The method of claim 1, wherein providing that a ratio between the numbers of carbons atoms and silicon atoms included in the entire gas mixture supplied in III) is defined as a C/Si ratio, the C/Si ratio is not less than 0.45 and is less than 1.4.

11. The method of claim 10, wherein the C/Si ratio is not less than 1.17 and is less than 1.4.

12. The method of claim 9, wherein the second temperature T2 is not less than 1325 degrees C. and is less than 1500 degrees.

13. A method of manufacturing a silicon carbide bulk substrate for epitaxial growth, the method comprising:
  I) annealing a silicon carbide bulk substrate that is tilted less than 5 degrees from <0001> face, in an atmosphere comprising hydrogen at a first temperature T1 for a treatment time t;
  II) reducing, in the hydrogen atmosphere, the temperature of the silicon carbide bulk substrate to a third temperature T3 lower than the first temperature T1;
  III) stopping supplying the reducing gas; and then
  IV) reducing the temperature of the silicon carbide bulk substrate to a temperature lower than the third temperature T3.

14. The method of claim 13, wherein the first temperature T1 is 1550 degrees C. or more.

15. The method of claim 13, wherein the third temperature T3 is 900 degrees C. or less.

16. The method of claim 13, wherein the silicon carbide bulk substrate is composed of 4H—SiC.

17. The method of claim 13, wherein the treatment time t ranges from 10 seconds to 180 seconds.

18. The method of claim 13, wherein providing that the lowest temperature at which annealing effect occurs I) is defined as an offset temperature To, and a value of (T1−To)×t ranges from 0 to 21000.

19. The method of claim 18, wherein the value of (T1−To)×t ranges from 500 to 13500.

20. The method of claim 13, wherein in IV), the silicon carbide bulk substrate is kept at an atmospheric pressure at 30 degrees C. or less for 60 minutes or more.

* * * * *